(12) United States Patent
Ikeda

(10) Patent No.: US 12,025,891 B1
(45) Date of Patent: Jul. 2, 2024

(54) DISPLAY DEVICE

(71) Applicant: Japan Display Inc., Tokyo (JP)

(72) Inventor: Masataka Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/402,788

(22) Filed: Jan. 3, 2024

(30) Foreign Application Priority Data

Jan. 23, 2023 (JP) ................................ 2023-008267

(51) Int. Cl.
| | |
|---|---|
| *G02F 1/1362* | (2006.01) |
| *G02F 1/1333* | (2006.01) |
| *G02F 1/1334* | (2006.01) |
| *G02F 1/1343* | (2006.01) |
| *G02F 1/1368* | (2006.01) |
| *H01L 27/12* | (2006.01) |

(52) U.S. Cl.
CPC ...... *G02F 1/136227* (2013.01); *G02F 1/1334* (2013.01); *G02F 1/1368* (2013.01); *H01L 27/1248* (2013.01)

(58) Field of Classification Search
CPC ............. G02F 1/1333; G02F 1/133345; G02F 1/133357; G02F 1/1334; G02F 1/1336; G02F 1/133615; G02F 1/1343; G02F 1/1362; G02F 1/136227; G02F 1/136286; G02F 1/1368; H01L 27/1248
See application file for complete search history.

(56) References Cited

U.S. PATENT DOCUMENTS 8,933,454 B2 * 1/2015 Kim .................... H01L 27/1288
257/59
2022/0004052 A1 1/2022 Ohue

FOREIGN PATENT DOCUMENTS

JP    2020-160254 A    10/2020

* cited by examiner

*Primary Examiner* — Thoi V Duong
(74) *Attorney, Agent, or Firm* — XSENSUS LLP

(57) ABSTRACT

A display device includes a transistor having an oxide semiconductor layer, a gate electrode opposed to the semiconductor layer, and a gate insulating film arranged between the oxide semiconductor layer and the gate electrode, a drain electrode connected to the transistor, a pixel electrode connected to the drain electrode, and a first insulating film and a second insulating film arranged between the drain electrode and the pixel electrode.

9 Claims, 17 Drawing Sheets

DISPLAY DEVICE

CROSS-REFERENCE TO RELATED APPLICATION

This application claims the benefit of priority to Japanese Patent Application No. 2023-008267, filed on Jan. 23, 2023, the entire contents of which are incorporated herein by reference.

FIELD

An embodiment of the present invention relates to a display device.

BACKGROUND

In recent years, a transparent display in which a background of one surface side opposite to the surface of another side can be visually recognized has been developed (see Patent Literature 1). Images can be viewed from both front and back surfaces in a transparent display, so that images or characters can be viewed from two opposite directions with the transparent display interposed therebetween.

SUMMARY

A display device according to an embodiment of the present invention includes a transistor having an oxide semiconductor layer, a gate electrode opposed to the semiconductor layer, and a gate insulating film arranged between the oxide semiconductor layer, a drain electrode connected to the transistor, a pixel electrode connected to the drain electrode, and a first insulating film and a second insulating film arranged between the drain electrode and the pixel electrode. The drain electrode extends in a first direction, the first insulating film includes a first contact hole and a second contact hole, the first contact hole and the second contact hole are arranged along the first direction in a region overlapping the drain electrode, and the second insulating film includes a third contact hole and a fourth contact hole, the third contact hole and the fourth contact hole are arranged along the first direction in a region overlapping the drain electrode, a symmetry axis of the first contact hole in the first direction is displaced in a second direction intersecting the first direction with respect to a symmetry axis of the third contact hole in the first direction, and a symmetry axis of the second contact hole in the first direction is displaced in a third direction opposite to the second direction with respect to a symmetry axis of the fourth contact hole in the first direction in a plan view.

DESCRIPTION OF EMBODIMENTS

Figure 1:
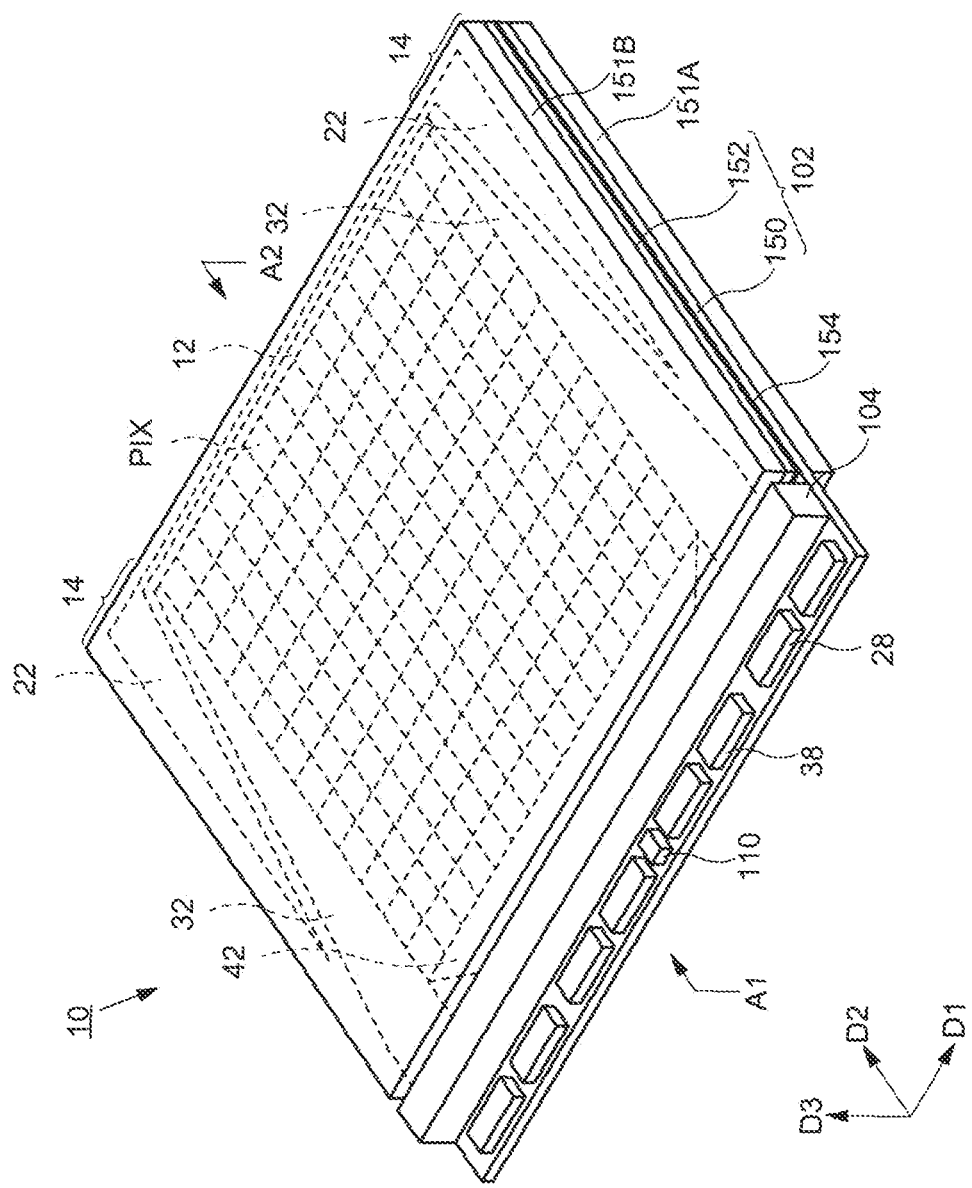
FIG. 1 is a perspective view illustrating an outline of a display device according to an embodiment of the present invention.

Hereinafter, embodiments of the present invention will be described with reference to the drawings and the like. However, the present invention can be implemented in various embodiments without departing from the gist thereof, and is not to be construed as being limited to the description of the embodiments exemplified below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in the present specification and the drawings, the same or similar elements as those described with respect to the above-described drawings are denoted by the same reference signs, and redundant description may be omitted. In addition, in this specification and the like, ordinal numbers are given for convenience in order to distinguish parts, portions, and the like, and do not indicate priority or order.

In the case where a plurality of films is formed by processing a certain film in the present invention, the plurality of films may have different functions and roles. However, the plurality of films is derived from a film formed as the same layer in the same process, and have the same layer structure and the same material. Therefore, the plurality of films is defined as being present in the same layer. In addition, in the case where a plurality of films is formed by processing a certain film, these are described separately from −1, −2, and the like in the present specification and the like.

In addition, expressions such as "above" and "below" in this specification and the like represent a relative positional relationship between a structure of interest and another structure. A direction from a first substrate to a pixel electrode, which will be described later, is defined as "above" in a side view, and a reverse direction thereof is defined as "below" in the present specification and the like. In this specification and claims, the expression "above" in describing the embodiment of arranging another structure above a certain structure shall include both arranging another structure directly above a certain structure and arranging another structure above a certain structure via yet another structure, unless otherwise specified.

In addition, a bottom-gate drive in this specification and the like is one in which on/off is controlled by a gate electrode arranged below a semiconductor layer. In addition, a top-gate drive in this specification and the like is one in which on/off is controlled by a gate electrode arranged above a semiconductor layer. Further, a dual-gate drive in the present specification is one in which on/off is controlled by inputting the same control signal to gate electrodes arranged above and below a semiconductor layer.

First Embodiment

A display device 10 according to an embodiment of the present invention will be described with reference to FIG. 1 to FIG. 17.

<Outline of Display Device>

FIG. 1 shows a perspective view of the display device 10 according to an embodiment of the present invention. The display device 10 includes a display panel 102 including an array substrate 150 (also referred to as a first substrate), a counter substrate 152 (also referred to as a second substrate), and a liquid crystal layer (not shown) between the array substrate 150 and the counter substrate 152, a gate driving circuit 28, and a source driving circuit 38, a light source 104, and a first transparent substrate 151A and a second transparent substrate 151B sandwiching the display panel 102. In the following explanation with reference to FIG. 1, one direction in the plane of the display panel 102 is a direction D1, a direction orthogonal to the direction D1 is a direction D2, and a direction orthogonal to a D1-D2 plane is a direction D3.

The array substrate 150 and the counter substrate 152 have light transmittance. The array substrate 150 and the counter substrate 152 are preferably transparent to visible light. The counter substrate 152 is arranged in the direction D3 to face the array substrate 150. The array substrate 150 and the counter substrate 152 are bonded to each other with a seal material 154 while being arranged opposite to each other with a gap therebetween. A liquid crystal layer (not shown) is arranged in the gap between the array substrate 150 and the counter substrate 152.

The display panel 102 has a display region 12 and a peripheral region 14 outside of the display region 12. A plurality of pixels PIX is arranged in a row direction and a column direction in the display region 12. In this case, the row direction refers to a direction parallel to the direction D1, and the column direction refers to a direction parallel to the direction D2. The display region 12 includes m pixels arranged in the row direction, and n pixels arranged in the column direction. The values of m and n are appropriately set in accordance with the display resolution in the vertical direction and the display resolution in the horizontal direction. A gate wiring (also referred to as a scanning signal line) is arranged in the direction D1, and a source wiring (also referred to as a data signal line) is arranged in the direction D2 in the display region 12.

The gate driving circuit 28 and the source driving circuit 38 are arranged in the peripheral region 14 of the array substrate 150. FIG. 1 shows an embodiment in which the gate driving circuit 28 and the source driving circuit 38 are arranged in an integrated circuit (IC) and implemented in a COG (Chip on Glass) method in the array substrate 150. The gate driving circuit 28 and the source driving circuit 38 are not limited to the illustrated embodiments, and may be implemented in a COF (Chip on Film) method or may be formed by a thin film transistor (TFT) of the array substrate 150.

A gate wiring region 32, a common wiring region 22, and a source wiring region 42 are arranged in the peripheral region 14. The gate wiring region 32 is a region where a pattern formed by a wiring connecting the gate driving circuit 28 and a gate wiring GL arranged in the display region 12 is arranged. The common wiring region 22 is a region where a pattern formed by a common wiring is arranged. The common wiring region 22 is used as a wiring for applying a common voltage to a common electrode 218 (see FIG. 8) arranged in the counter substrate 152. The source wiring region 42 is a region where a pattern formed by a wiring connecting the source driving circuit 38 and the data signal line arranged in the display region 12 is arranged.

The light source 104 has a structure along the direction D1. For example, the light source 104 is configured by a light-emitting diode (LED) arranged along the direction D1. A detailed structure of the light source 104 is not limited and may include optical members such as a reflector, a diffuser, a lens, and the like, in addition to the light-emitting diode arranged in the direction D1. The light source 104 and a light-emitting control circuit 110 for controlling the light source 104 may be arranged as separate members independent of the display panel 102. In addition, the light-emitting timing of the light source 104 may be controlled by the light-emitting control circuit 110 synchronized with the gate driving circuit 28 and the source driving circuit 38. The light-emitting control circuit 110 for controlling the light source 104 may be arranged as a separate member from the display panel 102 like the light source 104, may be mounted on the array substrate 150 as a separate component, or may be incorporated in the gate driving circuit 28 or the source driving circuit 38.

The first transparent substrate 151A and the second transparent substrate 151B are arranged so as to sandwich the display region 12 and the peripheral region 14. The first transparent substrate 151A and the second transparent substrate 151B function as a protective member of the display panel 102. In addition, the first transparent substrate 151A and the second transparent substrate 151B function as a light guide plate for introducing the light emitted from the light source 104 into the display panel 102 as described with respect to FIG. 2.

Figure 2:
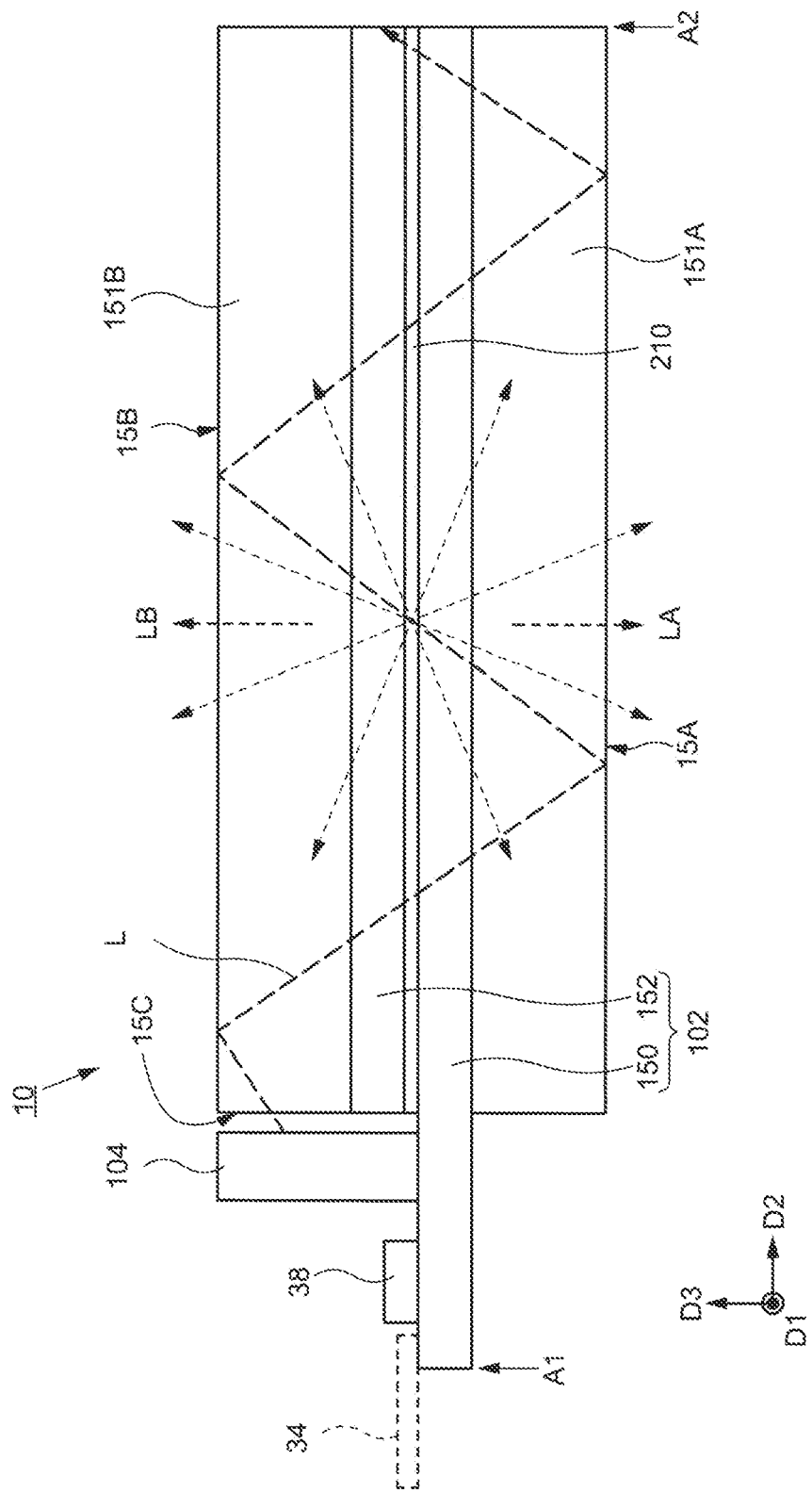
FIG. 2 is a schematic cross-sectional view showing a structure corresponding to A1-A2 of a display device shown in FIG. 1.

FIG. 2 shows a cross-sectional structure of the display device 10 corresponding to A1-A2 shown in FIG. 1. The first transparent substrate 151A is arranged on the array substrate 150 side of the display panel 102, and the second transparent substrate 151B is arranged on the counter substrate 152 side of the display panel 102 as shown in FIG. 2. A glass substrate or a plastic substrate is used as the first transparent substrate 151A and the second transparent substrate 151B. The first transparent substrate 151A and the second transparent substrate 151B preferably have refractive indices equivalent to those of the array substrate 150 and the counter substrate 152. The array substrate 150 and the first transparent substrate 151A, and the counter substrate 152 and the second transparent substrate 151B are bonded to each other with a transparent adhesive (not shown).

The display panel 102 is arranged such that the array substrate 150 and the counter substrate 152 face each other, and a liquid crystal layer 210 is arranged therebetween. The array substrate 150 is larger than the counter substrate 152 and has a size so that part of the peripheral region 14 is exposed from the counter substrate 152. A driving circuit (the source driving circuit 38 in FIG. 2) is arranged in the array substrate 150. In addition, a flexible printed circuit 34 is attached to the periphery of the array substrate 150.

The light source 104 is arranged adjacent to one side surface of the first transparent substrate 151A or the second transparent substrate 151B. FIG. 2 shows a configuration in which the light source 104 is arranged along one side of the second transparent substrate 151B. In addition, although FIG. 2 shows a configuration in which the light source 104 is attached to the array substrate 150, the configuration in which the light source 104 is arranged is not limited, and the attachment configuration is not limited as long as the attachment position can be fixed. For example, the light source 104 may be supported by a housing surrounding the display panel 102.

The light source 104 is arranged along first side surface 15C of the second transparent substrate 151B as shown in FIG. 2. The light source 104 irradiates the first side surface 15C of the second transparent substrate 151B with light L as shown in FIG. 2. The light source 104 may also be referred to as a side light source because it emits the light L toward the first side surface 15C. The first side surface 15C of the second transparent substrate 151B facing the light source 104 serves as a light-incidence surface.

The light L incident from the first side surface 15C of the second transparent substrate 151B propagates in a direction away from the first side surface 15C (the direction D2) while being reflected by a second plane 15B of the second transparent substrate 151B and a first plane 15A of the first transparent substrate 151A as schematically shown in FIG. 2. When the light L is directed to the outside from the first plane 15A of the first transparent substrate 151A and the second plane 15B of the second transparent substrate 151B, the light L proceeds from a medium having a large refractive index to a medium having a small refractive index. In this case, if an incident angle of the light L incident on the first plane 15A and the second plane 15B is larger than the critical angle, the light L is totally reflected, and is guided to the direction D2 while being reflected by the first plane 15A and the second plane 15B.

The liquid crystal layer 210 is formed of a polymer-dispersed liquid crystal. A scattering state and a non-scattering state are controlled for each pixel PIX (see FIG. 1) in the liquid crystal layer 210 composed of the polymer-dispersed liquid crystal. As shown in FIG. 2, if there is a pixel in which the liquid crystal layer 210 is in the scattering state in the light L propagating while being reflected by the first plane 15A and the second plane 15B, at least part of the light is scattered, the incident angle of the scattered light becomes an angle smaller than the critical angle, scattered lights LA and LB are respectively emitted to the outside from the first plane 15A and the second plane 15B, and the emitted scattered lights LA and LB are observed by an observer. The array substrate 150 and the counter substrate 152 and the first transparent substrate 151A and the second transparent substrate 151B have light transmittance (transparent to visible light) and are substantially transparent because the liquid crystal layer 210 is in the non-scattering state in regions in the display panel 102 other than the region where the scattered lights LA and LB are emitted, so that the observer can visually recognize the backside through the display panel 102.

Figure 3:
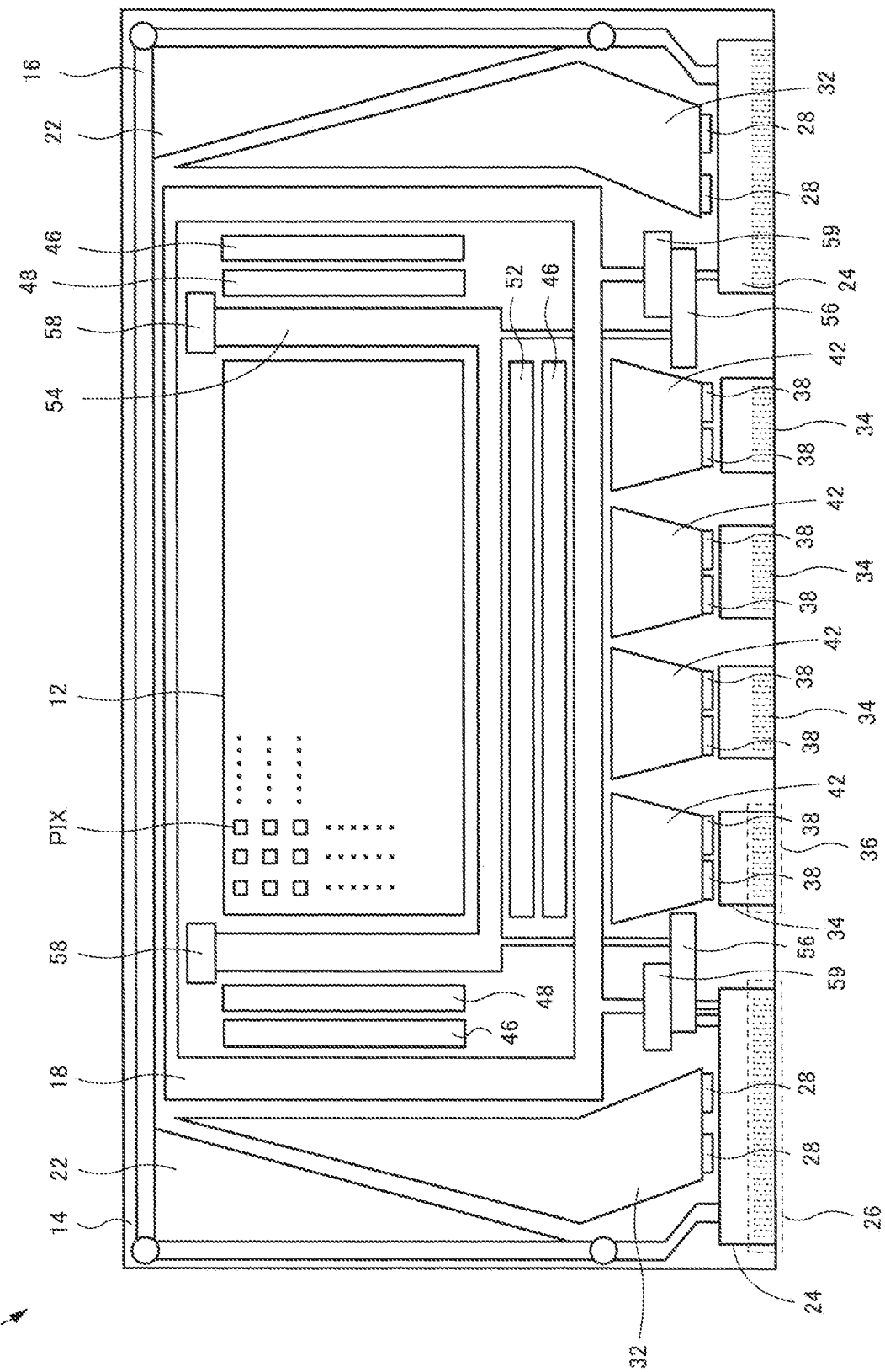
FIG. 3 is a plan view illustrating a configuration of a display device according to an embodiment of the present invention.

FIG. 3 is a plan view illustrating a configuration of the array substrate 150 of the display device 10 according to an embodiment of the present invention. The array substrate 150 includes the display region 12 and the peripheral region 14 as shown in FIG. 3.

The display region 12 includes the plurality of pixels PIX arranged in a matrix. Each of the plurality of pixels PIX includes a plurality of transistors and liquid crystal elements.

The peripheral region 14 is arranged to surround the display region 12. In addition, the peripheral region 14 in the array substrate 150 refers to a region from the display region 12 to an end portion of the array substrate 150. In other words, the peripheral region 14 refers to a region other than the region where the display region 12 is arranged on the array substrate 150 (that is, a region outside of the display region 12).

The gate wiring region 32, the source wiring region 42, common wirings 16 and 18, terminal portions 26 and 36, flexible printed circuits 24 and 34, and various test circuits are arranged in the peripheral region 14 in addition to the gate driving circuit 28 and the source driving circuit 38. The terminal portions 26 and 36 are arranged along one side of the array substrate 150.

The flexible printed circuit 24 is connected to the terminal portion 26. The flexible printed circuit 24 supplies various signals to the gate driving circuit 28, the common wirings 16 and 18, an ESD protection circuit 59, and a QD pad 56. The gate driving circuit 28 is connected to a plurality of gate wirings GL, and each of the plurality of gate wirings GL is electrically connected to each of the plurality of pixels PIX in the display region 12. A region where the plurality of gate wirings GL is arranged is shown as the gate wiring region 32 in FIG. 3 and a detailed arrangement of the plurality of gate wirings GL is omitted. The number of gate wirings GL connected to the two gate driving circuits 28 corresponds to the number of rows of the pixel PIX in the display region 12. In addition, although a configuration in which the gate wiring region 32 is arranged apart from the display region 12 is shown in FIG. 3, actually, the gate wiring GL and the pixel PIX are electrically connected.

The flexible printed circuit 34 is connected to the terminal portion 36. The flexible printed circuit 34 supplies a video signal to the source driving circuit 38. The source driving circuit 38 is connected to a plurality of source wirings SL, and each of the plurality of source wirings SL is electrically connected to each of the plurality of pixels PIX in the display region 12. A region where the plurality of source wirings SL is arranged is shown as the source wiring region 42 and a detailed arrangement of the plurality of source wirings SL is omitted in FIG. 3. The number of source wirings SL connected to the eight source driving circuits 38 corresponds to at least three times the number of columns of the pixel PIX in the display region 12. The case where the number of source wirings SL is four times the number of columns of the pixel PIX in the display region 12 will be described in the present embodiment. In addition, although a configuration in which the source wiring region 42 is arranged apart from the display region 12 is shown, actually the source wiring SL and the pixel PIX are electrically connected.

The common wiring 18, an ESD protection circuit 46, a gate inspection circuit 48, and an inspection line 54 are arranged between the gate wiring region 32 and the display region 12. The common wiring 18, the ESD protection circuit 46, a source inspection circuit 52, and the inspection line 54 are arranged between the source wiring region 42 and the display region 12. The inspection line 54 is connected to an ESD protection circuit 58 and the QD pad 56. In addition, the common wiring 18 is connected to the ESD protection circuit 59.

The common wiring 16 is arranged to surround the peripheral region 14 in the array substrate 150 and is supplied with a signal from the two flexible printed circuits 24. In addition, the common wiring 16 is electrically connected to the mesh-shaped common wiring region 22.

The display device 10 is not limited to a high speed drive panel such as the transparent display shown in FIG. 1 and FIG. 2. The display device 10 can be applied to a large panel used in a display device that is not a transparent display.

<Pixel Circuit>

Figure 4:
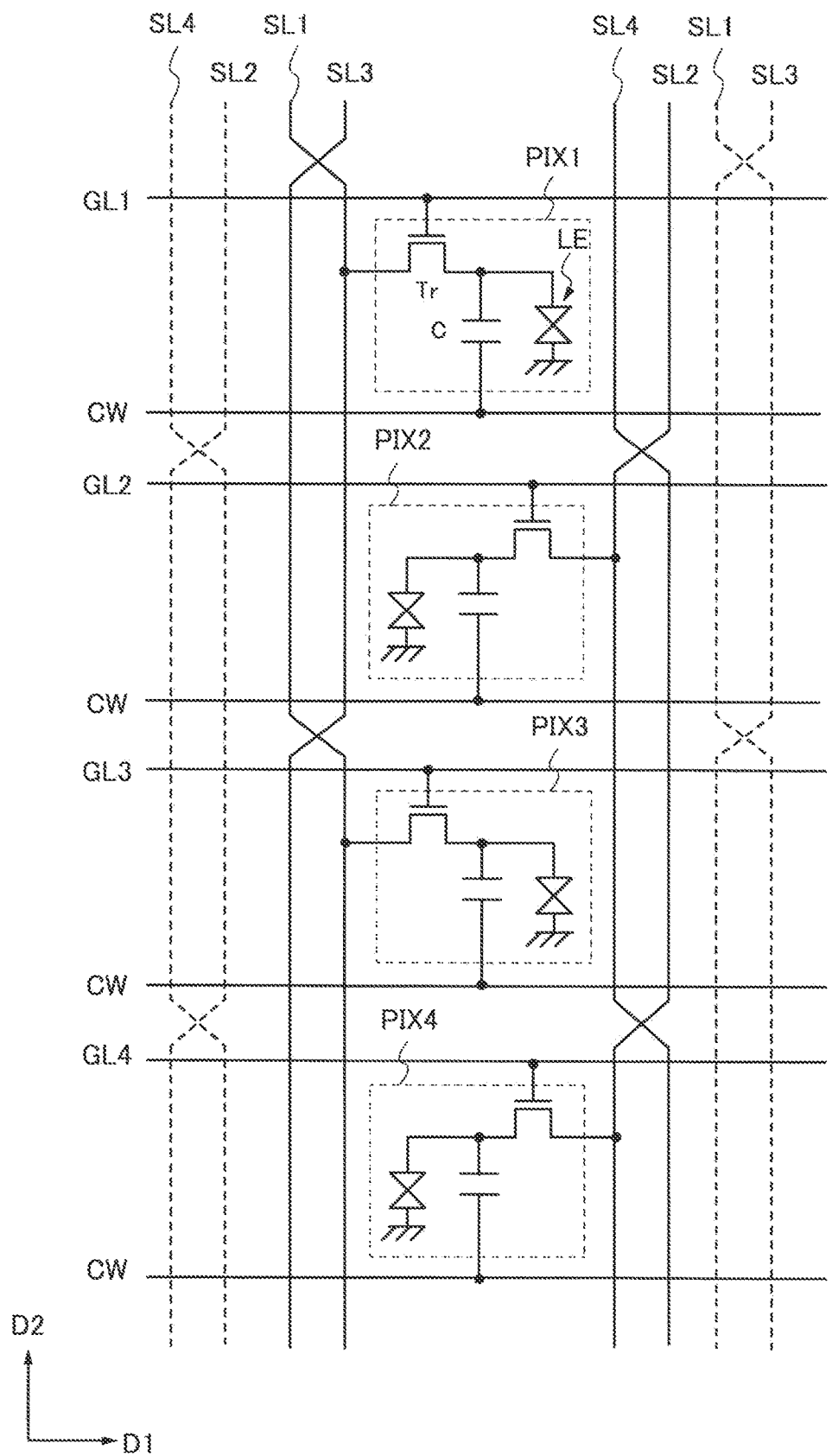
FIG. 4 is a circuit diagram showing pixels in a display device according to an embodiment of the present invention.

FIG. 4 is a diagram illustrating a pixel circuit of the pixel PIX included in the display device 10 according to an embodiment of the present invention. The display device 10 in which an on-voltage is simultaneously supplied to four gate wirings GL and four pixels PIX arranged in the column direction can be simultaneously charged by four source wirings SL will be described in the present embodiment. As a result, one horizontal period can be longer than a horizontal period in line order. In other words, it is possible to reduce the time required for scanning all the pixel lines arranged in the display region 12 to ¼. Therefore, a charging period of the pixel PIX can be sufficiently secured in a high-speed drive panel such as a transparent display or a large panel. Hereinafter, the configuration of the pixel PIX according to the present embodiment will be described in detail.

Four pixels PIX1 to PIX4 are arranged in the column direction (the direction D2) in FIG. 4. Each of the four pixels PIX1 to PIX4 is electrically connected to each of the four gate wirings GL1 to GL4. In addition, each of the four pixels PIX1 to PIX4 is electrically connected to each of the four source wirings SL1 to SL4. Each of the four pixels PIX1 to PIX4 is connected to a capacitance wiring CW. In the case where the pixels PIX1 to PIX4 are not distinguished from each other, they are referred to as the pixel PIX in the following explanation. In the case where the gate wirings GL1 to GL4 and the source wirings SL1 to SL4 are not distinguished from each other, they are referred to as the gate wiring GL and the source wiring SL.

Figure 8:
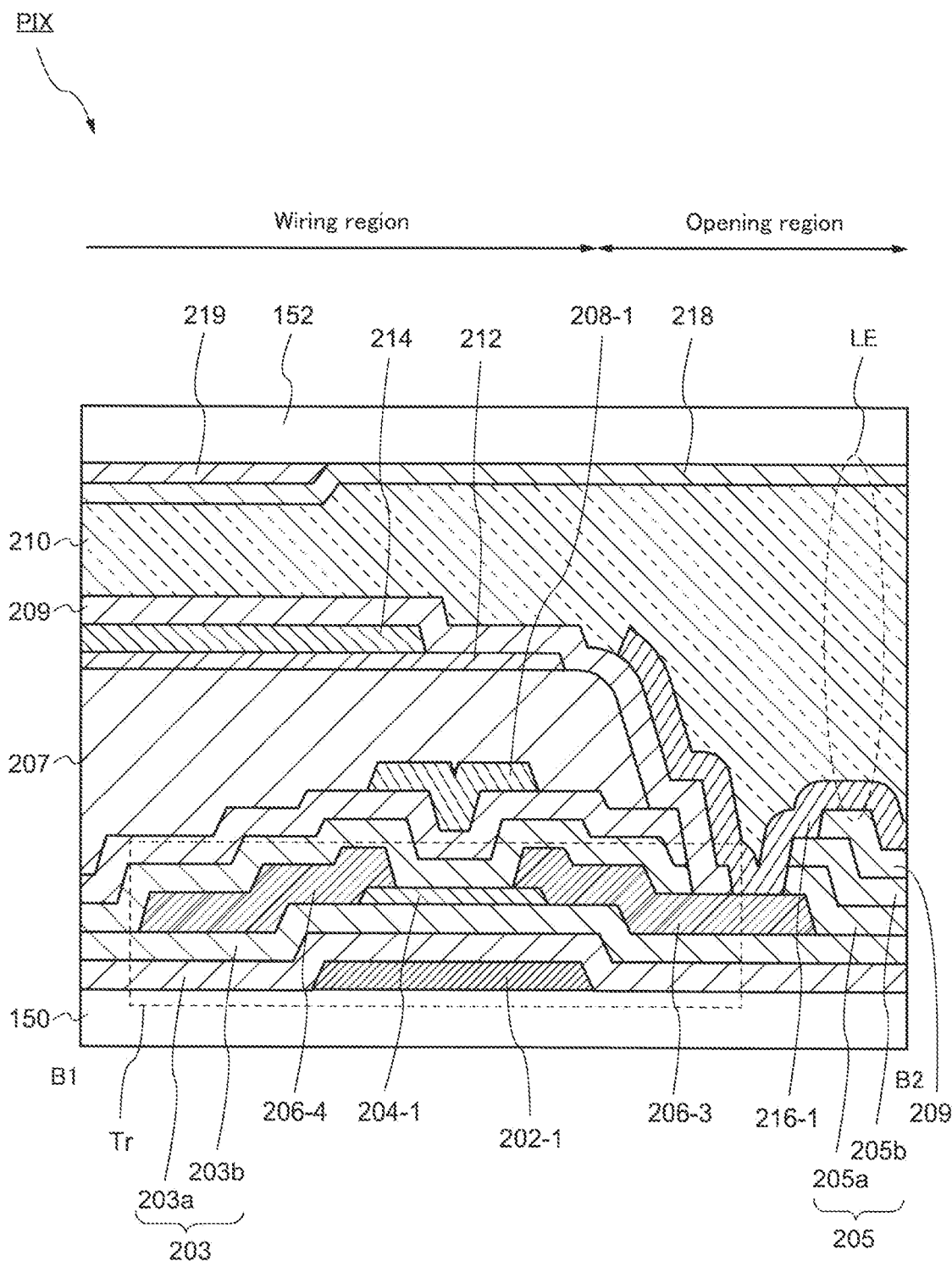
FIG. 8 is a cross-sectional view of a pixel in a display device according to an embodiment of the present invention.

The pixel PIX includes a transistor Tr, a liquid crystal element LE, and a storage capacitor C. A gate of the transistor Tr is connected to the gate wiring GL, a source of the transistor Tr is connected to the source wiring SL, and a drain of the transistor Tr is connected to one electrode of the liquid crystal element LE and one electrode of the storage capacitor C. The other electrode of the liquid crystal element LE is connected to the common electrode 218 (FIG. 8). The other electrode of the storage capacitor C is connected to the capacitance wiring CW.

The transistor Tr has a function of controlling a writing period of the video signal supplied from the source wiring SL to the pixel PIX by switching between the on-state and the off-state. In the case where the transistor Tr is turned on, a voltage corresponding to the video signal supplied from the source wiring SL can be written to the storage capacitor C electrically connected to the transistor Tr. In addition, in the case where the transistor Tr is turned off, the voltage held in the storage capacitor C can be held.

Figure 5:
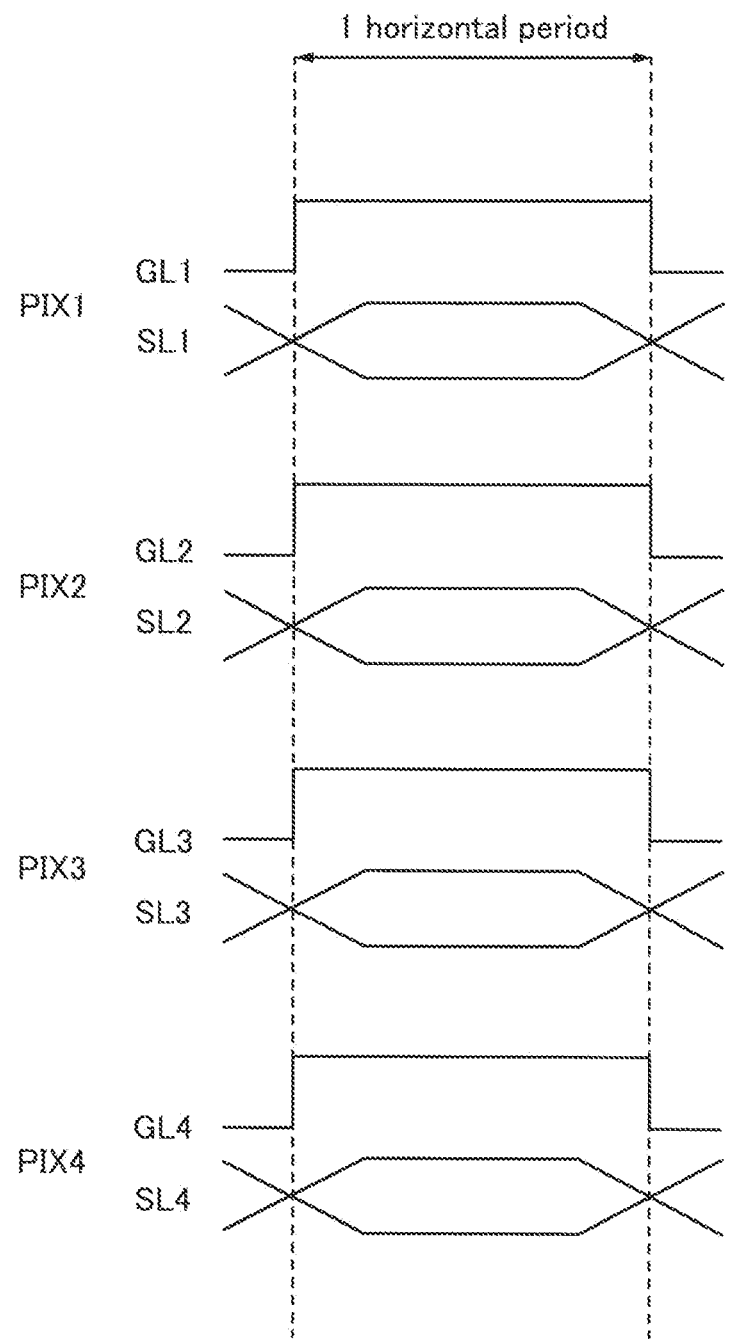
FIG. 5 is a timing chart of pixels in a display device according to an embodiment of the present invention.

FIG. 5 is a timing chart of the display device 10 according to an embodiment of the present invention. Normally, the gate wiring GL sequentially charges the pixel columns arranged in the direction D2 by using the same source wiring SL by supplying the on-voltage row-by-row. On the other hand, the on-voltage is simultaneously supplied to the four gate wirings GL, so that the transistors Tr of the four pixels PIX are simultaneously turned on in the present embodiment. The video signal is simultaneously supplied to the different source wirings SL1 to SL4 in this state. As a result, the four pixels arranged in the direction D2 can be driven simultaneously.

<Planar Layout of Pixels>

Figure 6:
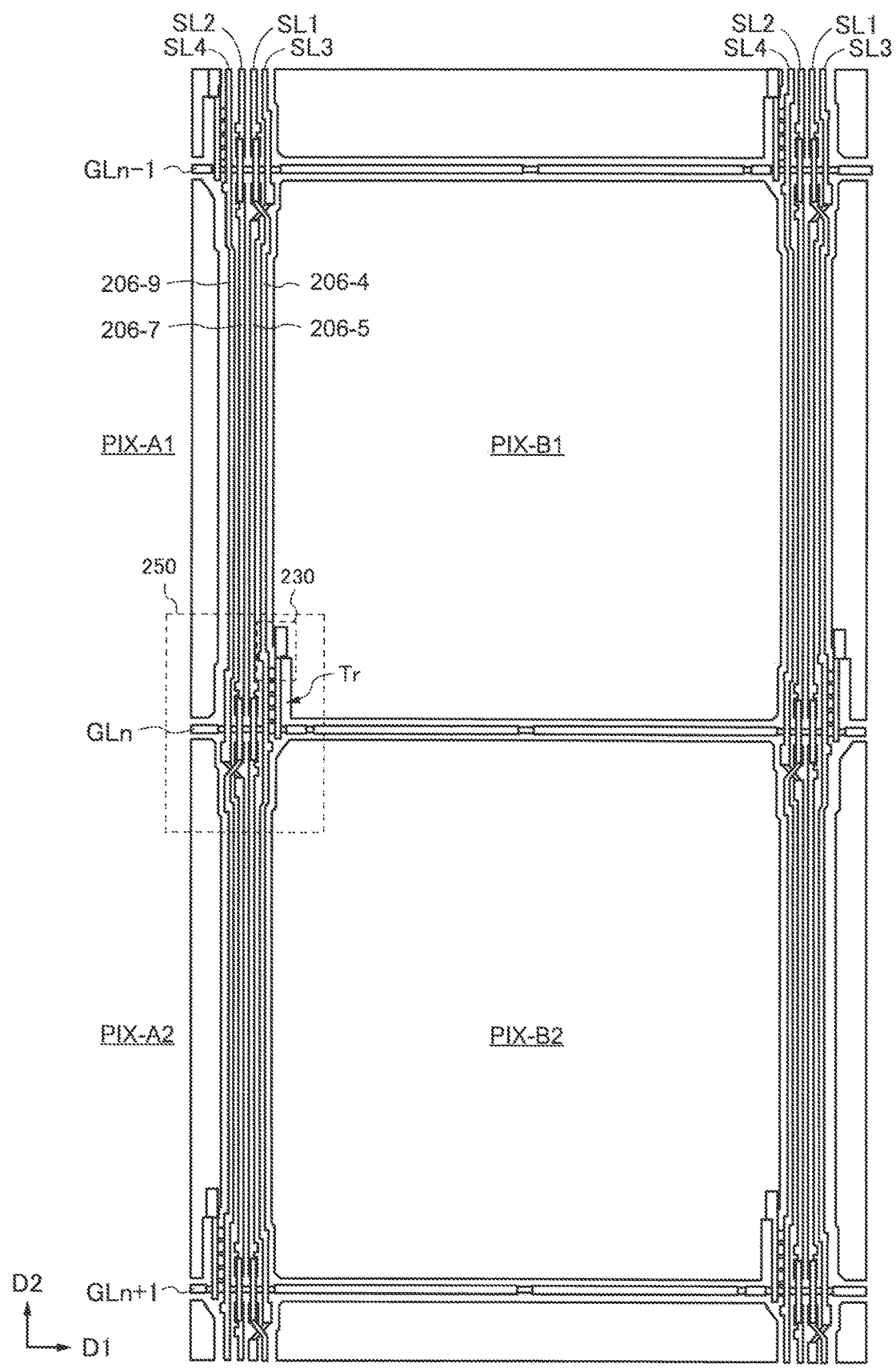
FIG. 6 is a planar layout of pixels in a display device according to an embodiment of the present invention.

A planar layout of the pixel PIX in the display device 10 according to an embodiment of the present invention will be described with reference to FIG. 6. FIG. 6 shows a configuration in which PIX-A1, PIX-A2, PIX-B1, and PIX-B2 are in a plan view.

As shown in FIG. 6, gate wirings GLn-1 to GLn+1 are arranged along the direction D1. In addition, the source wirings SL1 to SL4 are arranged in the direction D2. In this case, an opening region of the pixel PIX-B1 is a region surrounded by the adjacent gate wiring GLn-1, a gate wiring GLn, the source wiring SL1, and the source wiring SL4.

As shown in FIG. 6, the source wiring SL1 and the source wiring SL3, the source wiring SL2 and the source wiring SL4 are arranged so as to sandwich the pixels PIX-B1 and PIX-B2 of one column. In other words, four source wirings SL1 to SL4 are arranged between the pixels PIX-A1 and PIX-A2 of one column and the pixels PIX-B1 and PIX-B2 of one column.

The transistor Tr is arranged in a region 250 where the gate wiring GL and the source wirings SL1 to SL4 intersect. In addition, the transistor Tr is connected to the pixel electrode in a region 230. The pixel electrode is arranged in the opening region of the pixel PIX-B1.

The pixel electrode is connected to a drain electrode via a contact hole arranged in an insulating film in a display device such as a transparent display. In the case where a mask shift occurs when forming the contact hole, the magnitude of contact resistance between the pixel electrode and the drain electrode varies for each pixel, and the display quality of the display device will deteriorate.

Therefore, even if the mask shift occurs when forming the contact hole, a variation in the contact resistance between the pixel electrode and the drain electrode for each pixel is suppressed in the display device 10 according to an embodiment of the present invention.

Figure 7:
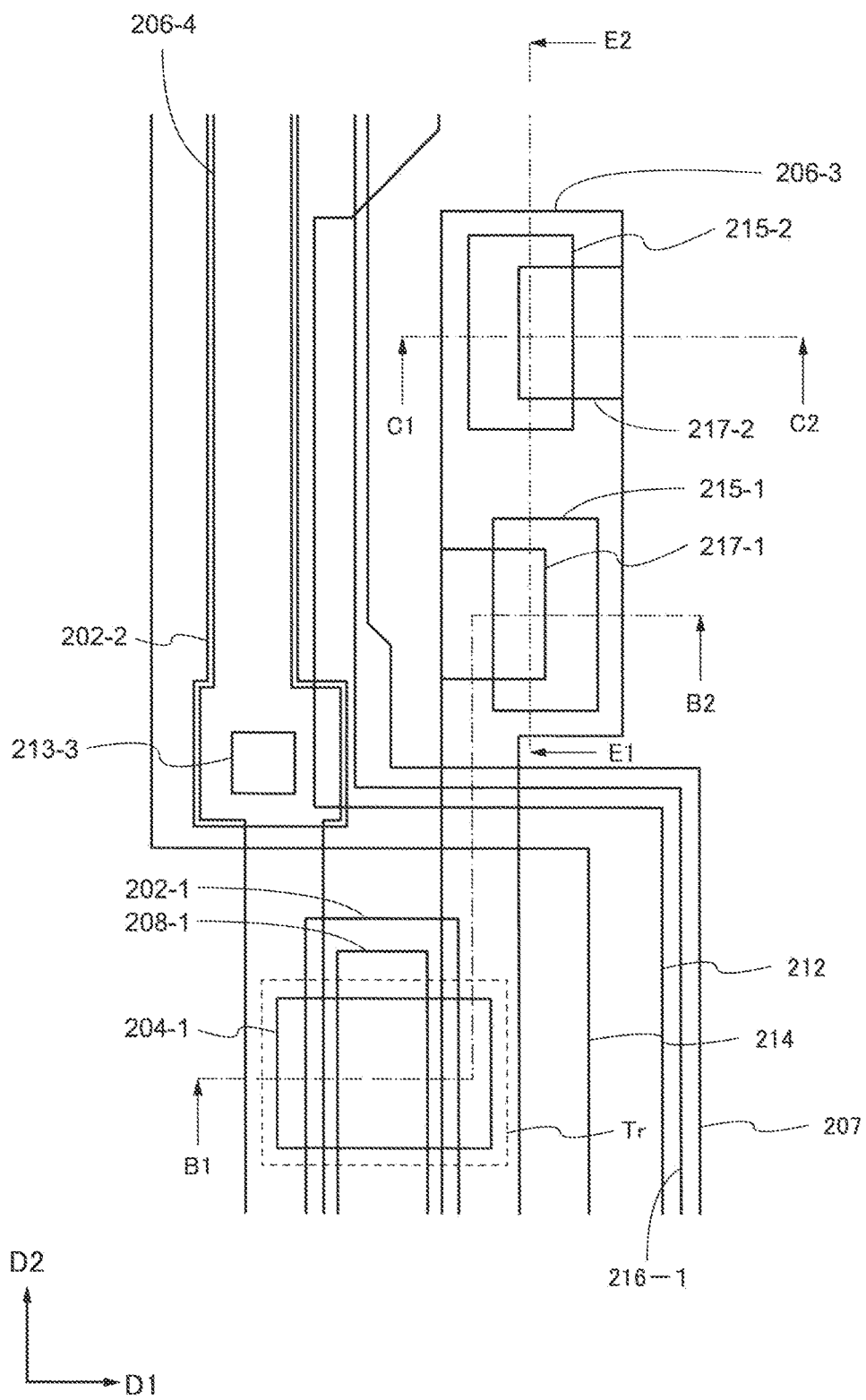
FIG. 7 is an enlarged view of a planar layout of pixels in a display device according to an embodiment of the present invention.

FIG. 7 is an enlarged view of the region 230 where the transistor Tr is arranged in the pixel PIX-B1. An arrangement of each layer in a plan view will be described in FIG. 7. FIG. 8 is a cross-sectional view of the region 230 along a line B1-B2 shown in FIG. 7. A stacking order of each layer in a cross-sectional view will be described in FIG. 8.

A conductive layer 202-1 and conductive layers 206-3 and 206-4 extend along the direction D2 as shown in FIG. 7. The conductive layer 202-1 functions as a gate wiring GL (gate electrode). The conductive layer 206-3 functions as a drain electrode, and the conductive layer 206-4 functions as a source wiring SL (source electrode). An oxide semiconductor layer 204-1 is arranged so as to overlap the conductive layer 202-1. In addition, a conductive layer 208-1 is arranged so as to overlap the conductive layer 202-1 and the oxide semiconductor layer 204-1. The conductive layer 208-1 functions as a back gate. Although the transistor Tr is described as a bottom-gate-driven transistor in the present embodiment, the present invention is not limited to this, and may be a top-gate-driven transistor or a dual-gate-driven transistor. The conductive layer 206-4 is connected to a conductive layer 202-2 arranged in the same layer as the conductive layer 202-1 via a contact hole 213-3.

Contact holes 215-1 and 215-2 are arranged in a region overlapping the conductive layer 206-3. Contact holes 217-1 and 217-2 are arranged in the region overlapping the conductive layer 206-3. The contact holes 215-1, 215-2, 217-1, and 217-2 will be described in detail later.

In addition, a planarization film 207 and a transparent conductive layer 212 are arranged to cover the source wiring SL and the transistor Tr. In the case where the display device 10 is applied to a transparent display, the planarization film 207 is preferably removed at the opening region of the pixel PIX. As a result, it is possible to suppress the planarization film 207 from absorbing light in the opening region. In addition, a conductive layer 214 is arranged to cover the transistor Tr. The transparent conductive layer 212 and the conductive layer 214 function as a capacitance wiring. The conductive layer 214 also functions as a light-shielding layer. A pixel electrode 216-1 is arranged in the opening region. The pixel electrode 216-1 does not cover the source wiring SL and the transistor Tr but covers part of the conductive layer 206-3.

As shown in FIG. 8, the transistor Tr is arranged above the array substrate 150. The transistor Tr includes the conductive layer 202-1 arranged above the array substrate 150, the oxide semiconductor layer 204-1 arranged opposite to the conductive layer 202-1, and a gate insulating film 203 arranged between the conductive layer 202-1 and the oxide semiconductor layer 204-1. The oxide semiconductor layer 204-1 is connected to the conductive layer 206-3 and the conductive layer 206-4.

An insulating film 205 (also referred to as a first insulating film) is arranged above the conductive layers 206-3 and 206-4. The insulating film 205 functions as a passivation film. For example, the insulating film 205 has a stacked structure of an oxide insulating film 205a and a nitride insulating film 205b. The gate insulating film 203 has a stacked structure of a nitride insulating film 203a and an oxide insulating film 203b. Oxygen is released from the oxide insulating film 205a and the oxide insulating film 203b during a process by sandwiching the oxide semiconductor layer 204-1 with the oxide insulating film 203b and the oxide insulating film 205a. This is preferable because oxygen defects in the oxide semiconductor layer 204-1 can be repaired. In addition, the conductive layer 208-1 is arranged at a position facing the oxide semiconductor layer 204-1 above the oxide insulating film 205.

The planarization film 207 is arranged above the conductive layer 208-1 and the insulating film 205. The planarization film 207 is arranged to release unevenness of various wirings constituting the transistor Tr. The planarization film 207 is arranged in a region overlapping the conductive layer 206-4 and the transistor Tr in FIG. 8. In addition, the planarization film 207 is not arranged between the conductive layer 206-3 and the pixel electrode 216-1 because the planarization film 207 is removed in the opening region. In other words, the insulating film 205 and an insulating film 209 (also referred to as a second insulating film) are arranged in contact with each other between the conductive layer 206-3 and the pixel electrode 216-1.

The transparent conductive layer 212 is arranged above the planarization film 207. The conductive layer 214 is arranged above the transparent conductive layer 212. The transparent conductive layer 212 and the conductive layer 214 function as the capacitance wiring CW. The conductive layer 214 also functions as a light-shielding layer. The insulating film 209 is arranged above the transparent conductive layer 212 and the conductive layer 214. The pixel electrode 216-1 is arranged above the insulating film 209. The pixel electrode 216-1 is connected to the conductive layer 206-3 via the contact holes 215-1 and 215-2 and the contact holes 217-1 and 217-2 arranged in the insulating films 205 and 209.

An end portion of the transparent conductive layer 212 is arranged between an end portion of the conductive layer 214 and the pixel electrode 216-1 above the planarization film 207 overlapping the transistor Tr as shown in FIG. 7 and FIG. 8. With this arrangement, it is possible to shield the transistor Tr from light and improve the light transmittance in the opening region.

The counter substrate 152 is arranged to face the array substrate 150. A light-shielding layer 219 and the common electrode 218 are arranged in the counter substrate 152. The light-shielding layer 219 functions as a black matrix. The light-shielding layer 219 is arranged in a region overlapping the conductive layer 206-4 in the structure shown in FIG. 8. The light-shielding layer 219 is arranged in a grid pattern so as to cover the gate wiring GL and the source wiring SL1 to the source wiring SL4. The common electrode 218 has a size extending over the entire surface of a display region 112. The light-shielding layer 219 may be formed of a metal film and function as an auxiliary electrode by being arranged in contact with the common electrode 218 formed of a transparent conductive film. The liquid crystal layer 210 is arranged between the array substrate 150 and the counter substrate 152 and is sealed with the seal material 154 (see FIG. 1). The pixel electrode 216-1, the liquid crystal layer 210, and the common electrode 218 constitute the liquid crystal element LE.

Figure 9:
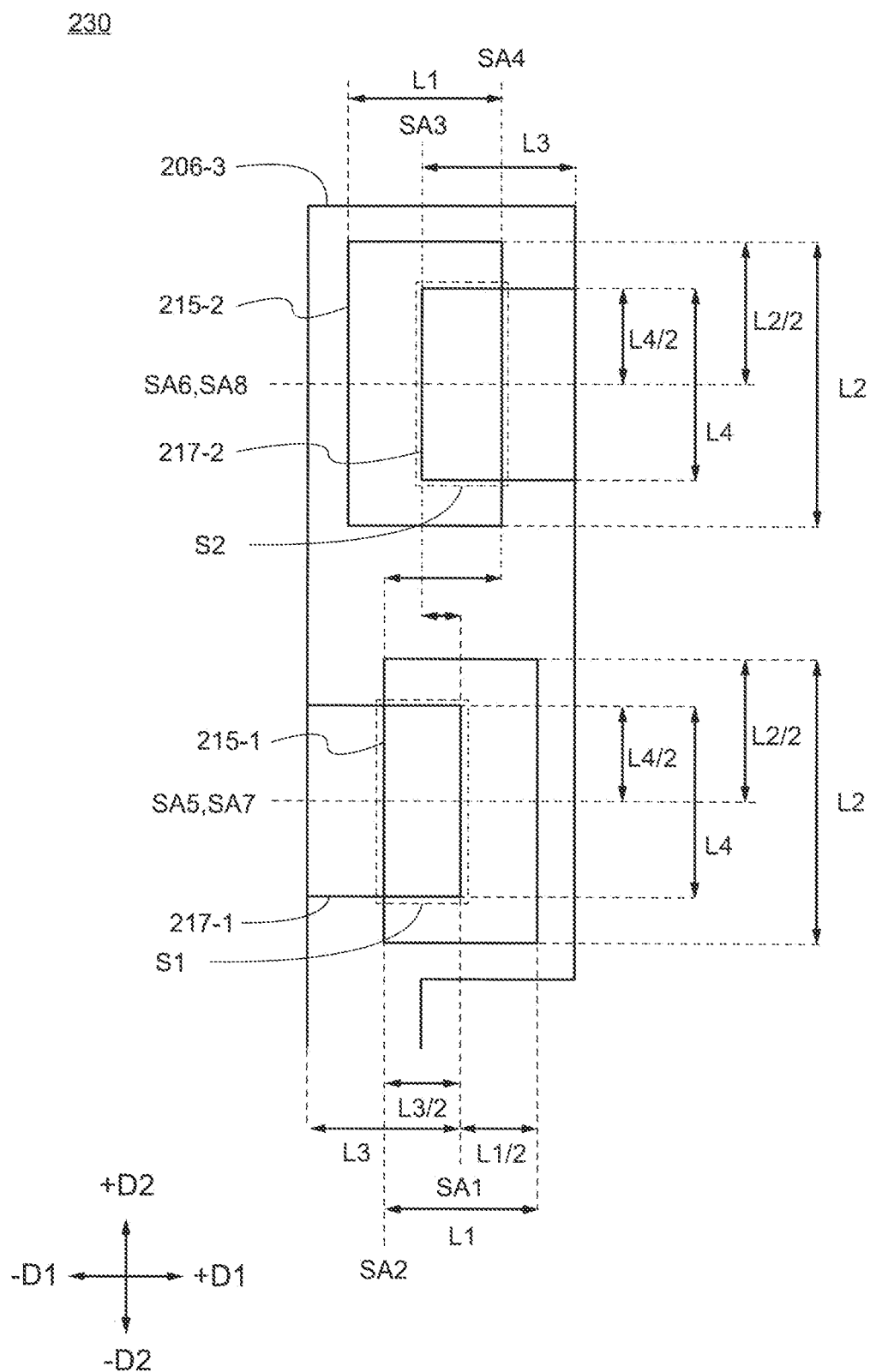
FIG. 9 is an enlarged view of the planar layout of the pixel shown in FIG. 7.

FIG. 9 is a diagram illustrating a positional relationship between the contact holes 215-1 and 215-2 formed in the insulating film 205 arranged above the conductive layer 206-3 and the contact holes 217-1 and 217-2 formed in the insulating film 209.

The conductive layer 206-3 extends in the direction D2 (also referred to as the first direction) as shown in FIG. 9. The contact holes 215-1 and 215-2 are arranged in the region overlapping the conductive layer 206-3 in the insulating film 205. In addition, the contact holes 217-1 and 217-2 are arranged in the region overlapping the conductive layer 206-3 in the insulating film 209.

An area of the contact hole 215-1 is represented by a length L1 in the direction D1×a length L2 in the direction D2. An area of the contact hole 217-1 is represented by a length L3 in the direction D1×a length L4 in the direction D2. In this case, a symmetry axis of the contact hole 215-1 in the direction D2 is represented by SA1, and a symmetry axis of the contact hole 217-1 in the direction D2 is represented by SA2.

An area of the contact hole 215-2 is represented by a length L1 in the direction D1×a length L2 in the direction D2. An area of the contact hole 217-2 is represented by a length L3 in the direction D1×a length L4 in the direction D2. In this case, a symmetry axis of the contact hole 215-2 in the direction D2 is represented by SA3, and a symmetry axis of the contact hole 217-2 in the direction D2 is represented by SA4. In addition, a symmetry axis of the contact hole 215-1 in the direction D1 is represented by SA5. In addition, a symmetry axis of the contact hole 217-1 in the direction D1 is represented by SA7. A symmetry axis of the contact hole 215-2 in the direction D1 is represented by SA6. A symmetry axis of the contact hole 217-2 in the direction D1 is represented by SA8. The symmetry axis SA5 and the symmetry axis SA7 overlap (coincide), and the symmetry axis SA6 and the symmetry axis SA8 overlap in FIG. 9.

The symmetry axis SA2 of the contact hole 217-1 in the direction D2 is arranged to be shifted in a direction −D1 (also referred to as a second direction) opposite to the direction D1 with respect to the symmetry axis SA1 of the contact hole 215-1 in the direction D2. In addition, the symmetry axis SA4 of the contact hole 217-2 in the direction D2 is arranged to be shifted in the direction D1 (also referred to as a third direction) with respect to the symmetry axis SA3 of the contact hole 215-2 in the direction D2.

The contact hole 215-2 is aligned with the contact hole 215-1 along the direction D2 in the region overlapping the conductive layer 206-3 in the insulating film 205. In addition, the contact hole 217-2 is aligned with the contact hole 217-1 along the direction D2 in the region overlapping the conductive layer 206-3 in the insulating film 209.

Although the case where the length L1 is the same as the length L3 will be described in the present embodiment, the length L1 may be a different length from the length L3. In addition, although the case where the length L2 is longer than the length L4 will be described in the present embodiment, the length L4 may be longer than the length L2. Further, the length L2 may be the same as the length L4.

The area of the contact hole 215-1 is larger than the area of the contact hole 217-1, and the area of the contact hole 215-2 is larger than the area of the contact hole 217-2 in FIG. 9. In addition, the area of the contact hole 215-1 is substantially the same as the area of the contact hole 215-2, and the area of the contact hole 217-1 is substantially the same as the area of the contact hole 217-2.

Although the example in which the symmetry axis SA3 of the contact hole 215-2 is shifted in the direction −D1 with respect to the symmetry axis SA1 of the contact hole 215-1 is described in FIG. 9, the symmetry axis SA1 and the symmetry axis SA3 may coincide with each other. In addition, although the example in which the symmetry axis SA4 of the contact hole 217-2 is shifted in the direction D1 with respect to the symmetry axis SA2 of the contact hole 217-1 is described, the symmetry axis SA2 and the symmetry axis SA4 may coincide with each other. The amount of deviation between the symmetry axis SA1 and the symmetry axis SA2 and the amount of deviation between the symmetry axis SA3 and the symmetry axis SA4 may be appropriately set with respect to the length of the conductive layer 206-3 in the direction D1.

The symmetry axis SA2 of the contact hole 217-1 is shifted in the direction −D1 with respect to the symmetry axis SA1 of the contact hole 215-1 by 50% of the length L1 of the contact hole 215-1 in the direction D1 in FIG. 9. In this case, the symmetry axis SA4 of the contact hole 217-2 is shifted in the direction D1 with respect to the symmetry axis SA3 of the contact hole 215-2 by 50% of the length L1 of the contact hole 217-2 in the direction D1.

In FIG. 9, an area S1 where the pixel electrode 216-1 is in contact with the conductive layer 206-3 via the contact hole 215-1 and the contact hole 217-1 (also referred to as a first region) is substantially the same as an area S2 where the pixel electrode 216-1 is in contact with the conductive layer 206-3 via the contact hole 215-2 and the contact hole 217-2 (also referred to as a second region). An area S3 obtained by summing together the area S1 and the area S2 corresponds to an area where the conductive layer 206-3 contacts the pixel electrode 216. If there is no deviation in the position of the mask for forming the contact hole, the area S3 obtained by summing together the area S1 and the area S2 in each of the plurality of pixels PIX is substantially the same.

Figure 10:
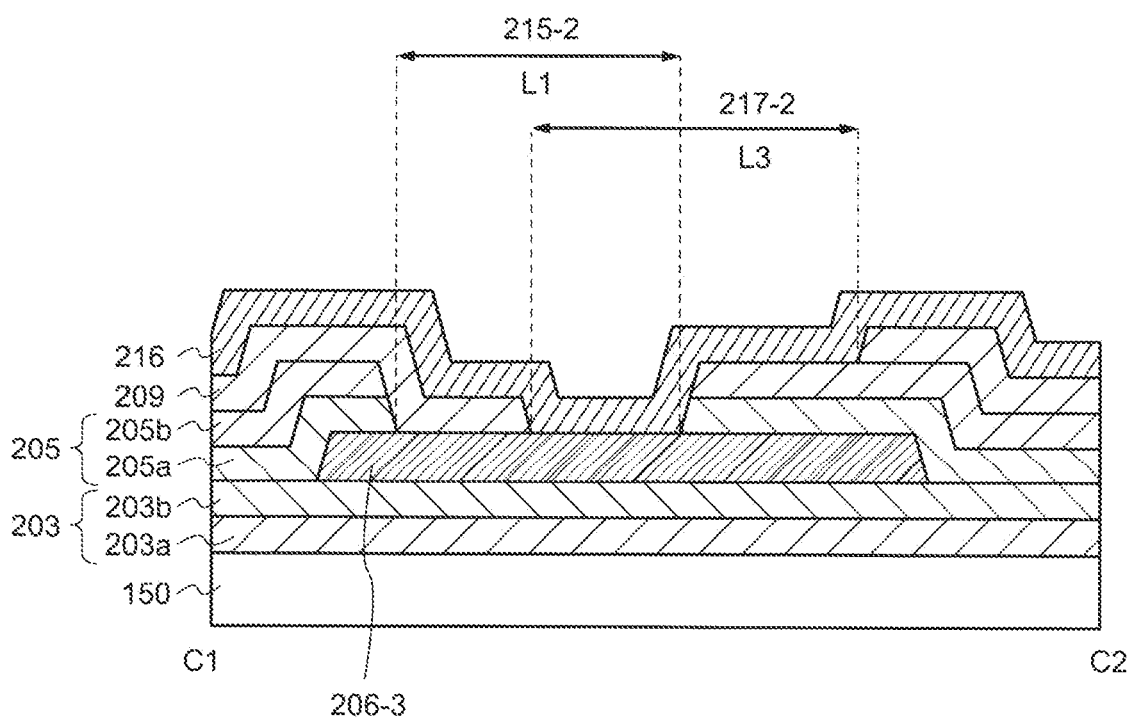
FIG. 10 is a diagram when the pixel shown in FIG. 7 is cut along a line C1-C2.

FIG. 10 is a cross-sectional view when the contact holes 215-2 and 217-2 shown in FIG. 7 are cut along a line C1-C2. The gate insulating film 203 (the nitride insulating film 203a and the oxide insulating film 203b) is arranged above the array substrate 150, and the conductive layer 206-3 functioning as a drain electrode is arranged above the gate insulating film 203 as shown in FIG. 10. The insulating film 205 (the oxide insulating film 205a and the nitride insulating film 205b) is arranged above the conductive layer 206-3. The contact hole 215-2 is arranged in the insulating film 205. The insulating film 209 is arranged above the insulating film 205. The contact hole 217-2 is arranged in the insulating film 209. The pixel electrode 216 is arranged above the insulating film 209. The pixel electrode 216 is connected to the conductive layer 206-3 via the contact hole 217-2 arranged in the insulating film 209 and the contact hole 215-2 arranged in the insulating film 205. The insulating film 209 is arranged in contact with a top surface of the conductive layer 206-3 as shown in FIG. 10. In addition, the pixel electrode 216 is arranged in contact with a top surface of the insulating film 205.

Figure 11:
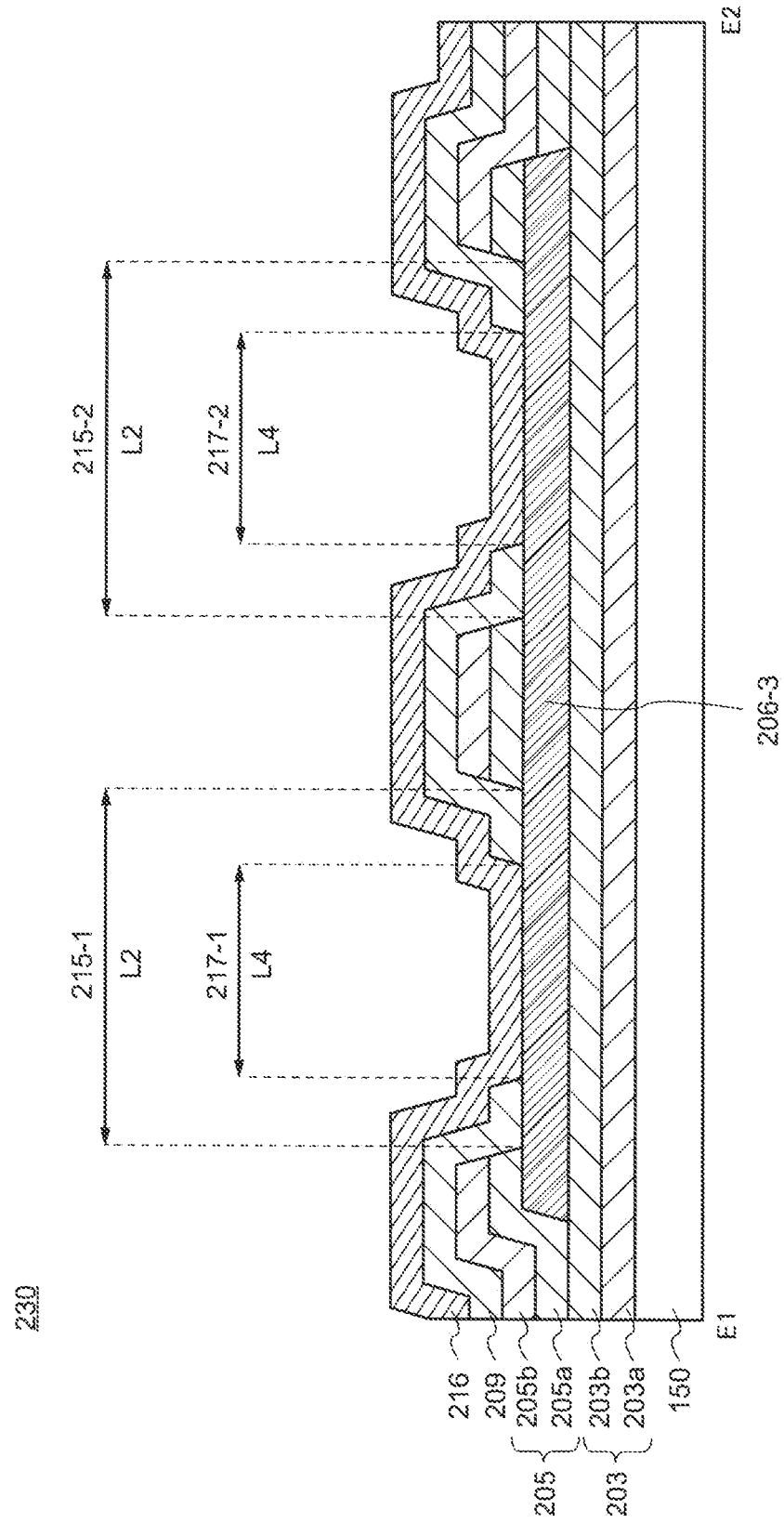
FIG. 11 is a diagram when the pixel shown in FIG. 7 is cut along a line E1-E2.

FIG. 11 is a cross-sectional view when the contact holes 215-2 and 217-2 shown in FIG. 7 are cut along a line E1-E2. The conductive layer 206-3 contacts the pixel electrode 216 at two locations as shown in FIG. 11. The length L2 of the contact holes 215-1 and 215-2 is longer than the length L4 of the contact holes 217-1 and 217-2. In addition, the symmetry axis of each of the contact holes 215-1 and 215-2 in the direction D1 coincides with the symmetry axis of each of the contact holes 217-1 and 217-2 in the direction D1. Therefore, end portions of each of the contact holes 217-1 and 217-2 are arranged in each of the contact holes 215-1 and 215-2. That is, the top surfaces and side surfaces of the contact holes 215-1 and 215-2 are covered with the insulating film 209. The insulating film 209 is in contact with the conductive layer 206-3 (drain electrode) in a region where the contact hole 215-1 is arranged and a region where the contact hole 215-2 is arranged.

Figure 12:
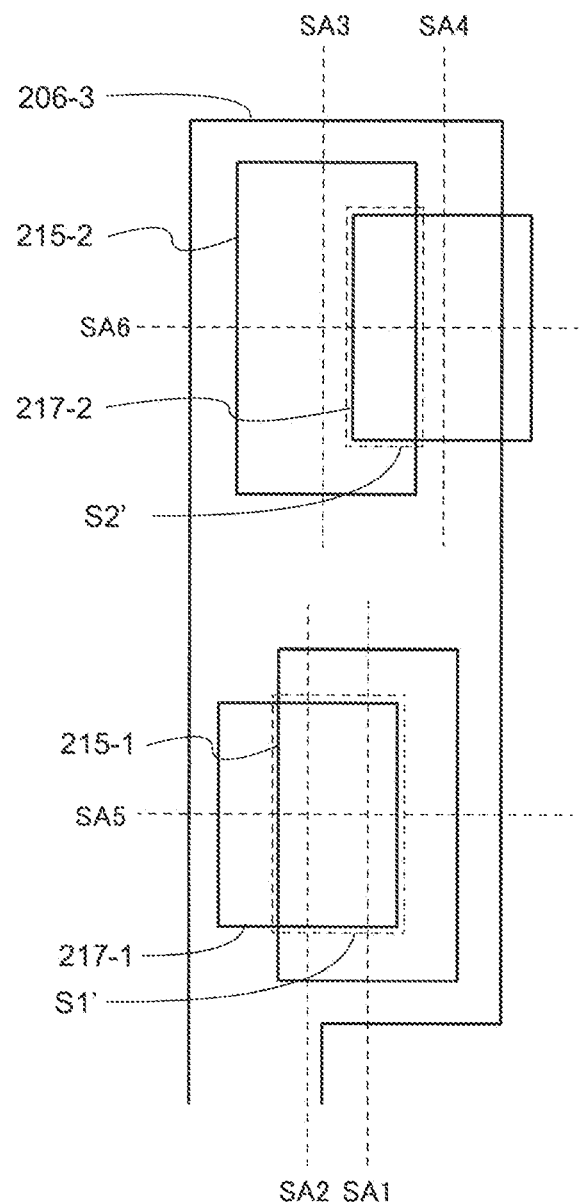
FIG. 12 is a planar layout of pixels in a display device according to an embodiment of the present invention.

FIG. 12 is a diagram in which the positions of the contact holes 217-1 and 217-2 are further shifted in the direction D1 with respect to the positions of the contact holes 215-1 and 215-2, as compared with FIG. 9.

The symmetry axis SA2 of the contact hole 217-1 is shifted in the direction −D1 with respect to the symmetry axis SA1 of the contact hole 215-1 by less than 50% of the length L1 of the contact hole 215-1 in the direction D1. In this case, the symmetry axis SA4 of the contact hole 217-2 is shifted in the direction D1 with respect to the symmetry axis SA3 of the contact hole 215-2 by 50% or more of the length L1 of the contact hole 215-2 in the direction D1. The symmetry axis SA2 of the contact hole 217 may be shifted in the direction −D1 with respect to the symmetry axis SA1 of the contact hole 215-1 by 100% or less of the length of the contact hole 215-1 in the direction D1 in FIG. 12. The case where the symmetry axis SA2 is shifted in the direction −D1 with respect to the symmetry axis SA1 by 100% of the length of the contact hole 215-1 in the direction D1 is a state where the contact hole 215-1 and the contact hole 217-1 do not overlap and the long side of the contact hole 215-2 overlaps the long side of the contact hole 217-2. Alternatively, the symmetry axis SA4 of the contact hole 217 may be shifted in the direction D1 with respect to the symmetry axis SA3 of the contact hole 215-2 by 100% or less of the length L1 of the contact hole 215-2 in the direction D1. The case where the symmetry axis SA4 is shifted in the direction D1 with respect to the symmetry axis SA3 by 100% of the length of the contact hole 215-2 in the direction D1 is a state where the contact hole 215-2 and the contact hole 217-2 do not overlap and the long side of the contact hole 215-1 overlaps the contact hole 217-1.

An area S1' of the region where the pixel electrode 216-1 is in contact with the conductive layer 206-3 via the contact hole 215-1 and the contact hole 217-1 is larger than an area S2' of the region where the pixel electrode 216-1 is in contact with the conductive layer 206-3 via the contact hole 215-2 and the contact hole 217-2 in FIG. 12. An area S3' obtained by summing together the area S1' and the area S2' corresponds to the area where the conductive layer 206-3 contacts the pixel electrode 216. As a result, even if a deviation occurs in the positions of the respective masks for forming the contact holes 215 and 217, the area S3' obtained by summing together the area S1' and the area S2' can be substantially the same in each of the plurality of pixels PIX. In addition, the contact holes 217-1 and 217-2 are shifted only in the direction D1. Therefore, the area S3 of the pixel electrode 216 and the conductive layer 206-3 shown in FIG. 9 and the area S3' of the pixel electrode 216 and the conductive layer 206-3 shown in FIG. 12 are substantially the same.

Figure 13:
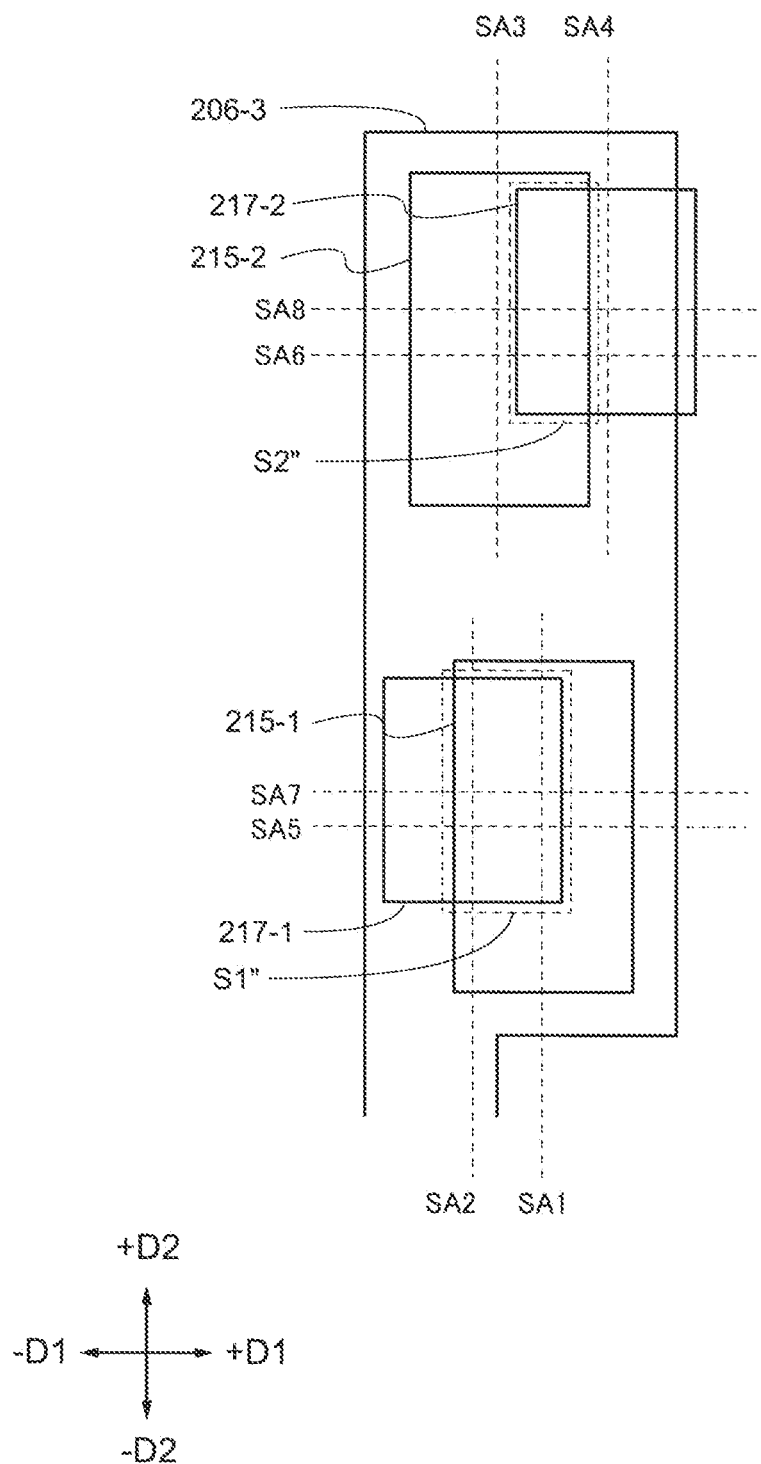
FIG. 13 is a planar layout of pixels in a display device according to an embodiment of the present invention.

FIG. 13 is a diagram in which the positions of the contact holes 217-1 and 217-2 are further shifted in the direction D1 and the direction D2 with respect to the positions of the contact holes 215-1 and 215-2, as compared with FIG. 9.

Even in the case where the positions of the contact holes 217-1 and 217-2 are shifted in the direction D1 and the direction D2 with respect to the positions of the contact holes 215-1 and 215-2, an area S1" where the pixel electrode 216-1 is in contact with the conductive layer 206-3 via the contact hole 215-1 and the contact hole 217-1 is larger than an area S2" where the pixel electrode 216-1 is in contact with the conductive layer 206-3 via the contact hole 215-2 and the contact hole 217-2. An area S3" obtained by summing together the area S1" and the area S2" corresponds to the area where the conductive layer 206-3 contacts the pixel electrode 216. As a result, even if a deviation occurs in the positions of the respective masks for forming the contact holes 215 and 217, the area S3" obtained by summing together the area S1" and the area S2" can be substantially the same in each of the plurality of pixels PIX. In addition, the length L2 of the contact holes 215-1 and 215-2 in the direction D2 is longer than the length L4 of the contact holes 217-1 and 217-2 in the direction D2. Therefore, even if the contact holes 217-1 and 217-2 are displaced in the direction D2, it is possible to suppress them from protruding from the contact holes 215-1 and 215-2 in the direction D2. In other words, if the contact holes 217-1 and 217-2 do not protrude from the contact holes 215-1 and 215-2 in a direction +D2 or direction −D2, the symmetry axis SA7 and SA8 may be deviated in the direction+D2 or direction −D2 with respect to the symmetry axis SA5 and SA6. In addition, since a range in which the deviation of the symmetry axis SA2 and SA4 is allowed with respect to the symmetry axis SA1 and SA3 is the same as in FIG. 9, detailed explanations will be omitted.

For example, in the case where the end portion of the contact hole 215-1 formed in the insulating film 205 is present inside the end portion of the contact hole 217-1 formed in the insulating film 209 in the display device shown in FIG. 9, the insulating film 205 may be etched along the shape of the contact hole 217-1 at the lower end portion of the contact hole 217-1 present above the insulating film 205. As a result, voids may be generated at the lower end portion of the contact hole 217-1 existing above the insulating film 205, and the pixel electrode 216 may be broken. This may hinder the electrical connection between the pixel electrode 216 and the conductive layer 206-3. In addition, in the case where the pixel electrode and the drain electrode are brought into contact with each other at one location, the contact area between the pixel electrode and the drain electrode may vary for each pixel if a deviation occurs between the mask for forming the contact hole in the insulating film 205 and the mask for forming the contact hole in the insulating film 209.

The contact hole is usually formed by etching using a resist mask. The position of the resist mask may vary in the substrate plane depending on the deflection of the substrate. In the case where a contact hole needs to be formed for each of the insulating film 205 and the insulating film 209, the contact area between the pixel electrode and the drain electrode may vary for each pixel when a positional deviation occurs between the resist mask formed above the insulating film 205 and the resist mask formed above the insulating film 209. In other words, variations in the contact resistance between the pixel electrode and the drain electrode occur for each pixel. As a result, the display quality of the display device may be deteriorated due to the variations in the contact resistance.

The contact holes 215-1 and 215-2 are formed in the insulating film 205 present between the pixel electrode 216-1 and the conductive layer 206-3 functioning as the drain electrode, and the contact holes 217-1 and 217-2 are formed in the insulating film 209, respectively in the display device 10 according to an embodiment of the present invention. In addition, the position where the contact hole 215-2 is arranged and the position where the contact hole 217-2 is arranged are arranged so as to be displaced from each other. As a result, the lower end portion of the contact hole 217-1 is present above the insulating film 205, and the lower end portion of the contact hole 217-1 is also present above the conductive layer 206-3. Therefore, even if the step breakage of the pixel electrode 216 occurs at the end portion of the contact hole 217-1 present above the insulating film 205, the step breakage of the pixel electrode 216 can be suppressed from occurring at the end portion of the contact hole 217-1 present above the conductive layer 206. As a result, the electrical connection between the pixel electrode 216 and the conductive layer 206-3 can be ensured.

In addition, since the pixel electrode and the drain electrode are brought into contact with each other at two positions, even in the case where a deviation occurs in the mask for forming the contact hole in the insulating film 209, it is possible to suppress the occurrence of variation in the contact region between the pixel electrode and the drain electrode for each pixel. In other words, it is possible to suppress the occurrence of variation in the contact resistance between the pixel electrode and the drain electrode for each pixel. As a result, it is possible to suppress the display quality of the display device from deteriorating.

Next, the region 250 where the gate wiring GL and the source wirings SL1 to SL4 intersect will be described with reference to FIG. 14 to FIG. 17. The region 230 described above is also illustrated in FIG. 14 to FIG. 17.

Figure 14:
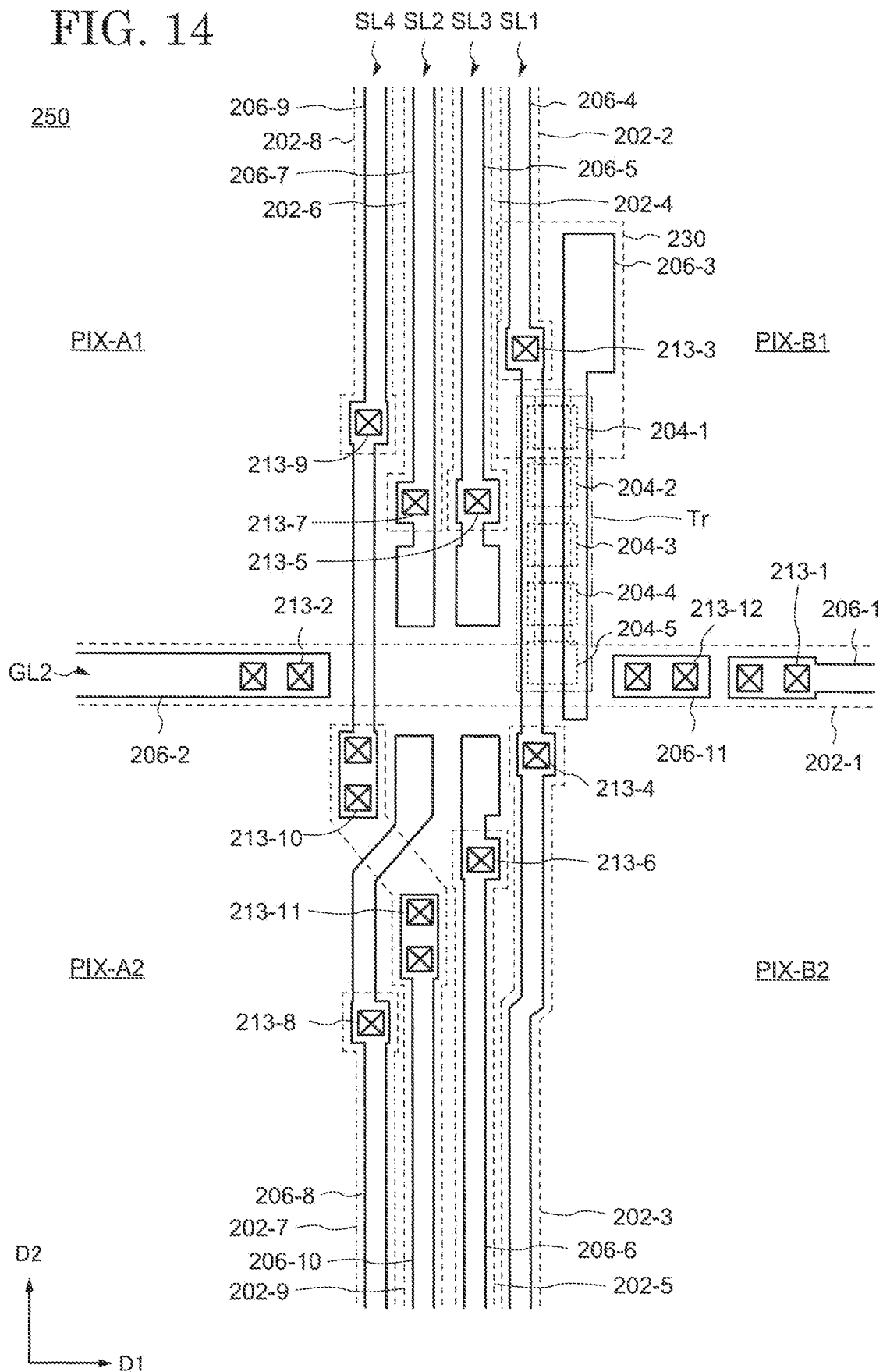
FIG. 14 is a planar layout of pixels in a display device according to an embodiment of the present invention.

FIG. 14 is a planar layout of the conductive layers 202-1 to 202-9, the oxide semiconductor layers 204-1 to 204-5, and the conductive layers 206-1 to 206-11 in the region 250. The conductive layers 202-1 to 202-9 are arranged above the array substrate 150 (glass substrate). The conductive layer 202-1 extends in the direction D1 but has a region that branches in the direction D2. In addition, the conductive layers 202-2 to 202-9 extend in the direction D2. The oxide semiconductor layers 204-1 to 204-5 are arranged above the conductive layer 202-1 via the gate insulating film 203 (see FIG. 8). The oxide semiconductor layers 204-1 to 204-5 are arranged side by side in the direction D2. An example in which five oxide semiconductor layers 204-1 to 204-5 are used to form the transistor Tr is shown in the present embodiment. The effect of heat generation on the oxide semiconductor layer can be reduced by being separately arranged in the plurality of the oxide semiconductor layers 204-1 to 204-5. The number of oxide semiconductor layers is not particularly limited. Light guided from the conductive layer 202-1 side to the glass substrate (the array substrate 150) toward the oxide semiconductor layers 204-1 to 204-5 is reflected by the conductive layer 202-1, so that light leakage is less likely to occur in the oxide semiconductor layers 204-1 to 204-5. The conductive layers 206-1 to 206-11 are arranged above the gate insulating film 203 and the oxide semiconductor layers 204-1 to 204-5. The conductive layers 206-1, 206-2, and 206-11 extend in the direction D1 and the conductive layers 206-3 to 206-10 extend in the direction D2.

The conductive layer 202-1 overlaps the conductive layers 206-1, 206-2, and 206-11. The conductive layer 202-1 is connected to the conductive layer 206-1 via a contact hole 213-1 arranged in the gate insulating film 203, and is connected to the conductive layer 206-2 via a contact hole 213-2 arranged in the gate insulating film 203. A region of the conductive layer 202-1 extending in the direction D1 functions as a gate wiring. In addition, a region of the conductive layer 202-1 extending in the direction D2 functions as a gate electrode.

The conductive layers 202-2 and 202-3 overlap the conductive layer 206-4. The conductive layer 202-2 is connected to the conductive layer 206-4 via the contact hole 213-3 arranged in the gate insulating film 203, and the conductive layer 202-3 is connected to the conductive layer 206-4 via a contact hole 213-4 arranged in the gate insulating film 203. The conductive layer 206-4 intersects the conductive layer 202-1. The conductive layer 206-4 functions as a first source wiring SL1. In addition, a region of the conductive layer 206-4 that does not overlap the conductive layers 202-2 and 202-3 functions as a source electrode of the transistor Tr. The conductive layer 206-3 functions as a drain electrode of the transistor Tr.

The conductive layer 202-4 overlaps the conductive layer 206-5 and is connected to the conductive layer 206-5 via a contact hole 213-5 arranged in the gate insulating film 203. The conductive layer 202-5 overlaps the conductive layer 206-6 and is connected to the conductive layer 206-6 via a contact hole 213-6 arranged in the gate insulating film 203. The conductive layer 206-5 is connected to the conductive layer 206-6 via a conductive layer 208-2 (see FIG. 15). As a result, the conductive layer 206-5, the conductive layer 206-6, and the conductive layer 208-2 function as a third source wiring SL3.

The conductive layer 202-6 overlaps the conductive layer 206-7 and is connected to the conductive layer 206-7 via a contact hole 213-7 arranged in the gate insulating film 203. The conductive layer 202-7 overlaps the conductive layer 206-8 and is connected to the conductive layer 206-8 via a contact hole 213-8 arranged in the gate insulating film 203. The conductive layer 206-7 is connected to the conductive layer 206-8 via a conductive layer 208-3 (see FIG. 15). The conductive layer 206-7, the conductive layer 206-8, and the conductive layer 208-3 function as a second source wiring SL2.

The conductive layer 202-8 overlaps the conductive layer 206-9 and is connected to the conductive layer 206-9 via a contact hole 213-9 arranged in the gate insulating film 203. The conductive layer 202-9 overlaps the conductive layer 206-9 and the conductive layer 206-10. The conductive layer 202-9 is connected to the conductive layer 206-9 via a contact hole 213-10 arranged in the gate insulating film 203.

In addition, the conductive layer 202-9 is connected to the conductive layer 206-10 via a contact hole 213-11 arranged in the gate insulating film 203. The conductive layer 206-9 has a region that intersects the conductive layer 202-1. The conductive layer 206-9 and the conductive layer 206-10 function as a fourth source wiring SL4.

In addition, the conductive layer 202-1 overlaps the conductive layer 206-11 and is connected to the conductive layer 206-11 via a contact hole 213-12 arranged in the gate insulating film 203.

The conductive layer 202-9 and the conductive layer 206-8 have a bent region. The conductive layer 202-9 has a region that overlaps and intersects the conductive layer 206-8. That is, the second source wiring SL2 and the fourth source wiring SL4 have a region intersecting each other.

Although not described in detail, the conductive layer 202-2 and the conductive layer 206-5 have a bent region as shown in FIG. 6. The conductive layer 202-2 has a region that overlaps and intersects the conductive layer 206-5. That is, the first source wiring SL1 and the third source wiring SL3 have a region intersecting each other.

The gate wiring GL is constituted by stacking the conductive layer 202-1 and the conductive layers 206-1 and 206-2 as shown in FIG. 14. The conductive layer 202-1 extends along the direction D1. In addition, only the conductive layer 202-1 is arranged in the gate wiring GL in a region that intersects the source wiring SL1 to the source wiring SL4, and the conductive layer 206-1 and the conductive layer 206-2 are arranged apart from each other. In addition, the source wiring SL1 is constituted by stacking the conductive layers 202-2 and 202-3 and the conductive layer 206-4. In addition, only the conductive layer 206-4 is arranged in the source wiring SL in a region that intersects the gate wiring GL, and the conductive layer 202-2 and the conductive layer 202-3 are arranged apart from each other. As a result, even if static electricity is generated in the manufacturing process of the display region 12 and the peripheral region 14 in the array substrate 150, static electricity can be released, and the occurrence of defects caused by static electricity can be suppressed.

Figure 15:
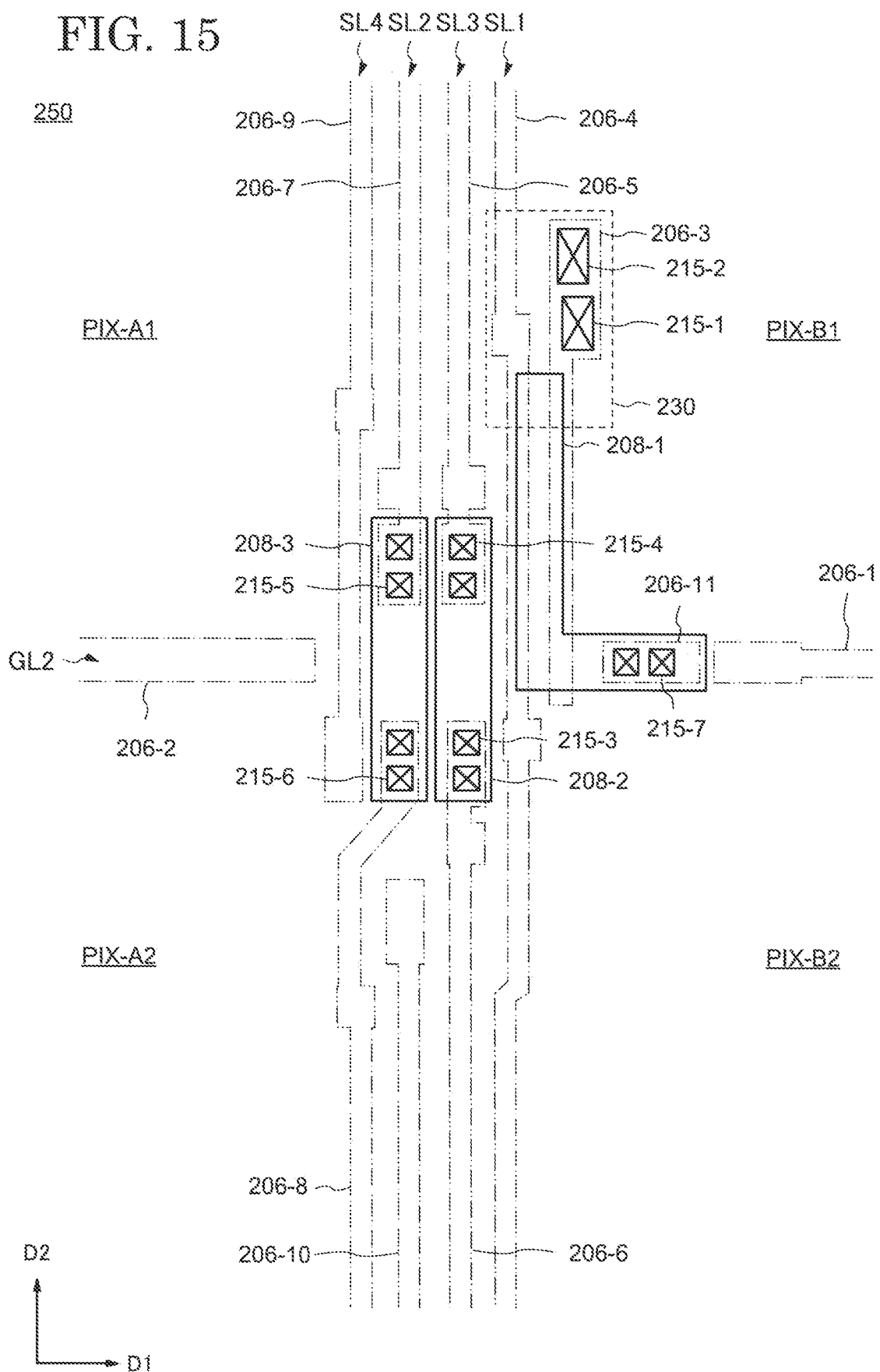
FIG. 15 is a planar layout of pixels in a display device according to an embodiment of the present invention.

FIG. 15 is a planar layout of the conductive layers 206-1 to 206-11 and the conductive layers 208-1 to 208-3 in the region 250. The conductive layers 206-1 to 206-11 are as described in FIG. 15. The conductive layers 208-1 to 208-3 are arranged above the insulating film 205 (see FIG. 8). The conductive layer 208-1 has a region extending in the direction D2 and a region extending in the direction D1. The region extending in the direction D2 overlaps the oxide semiconductor layers 204-1 to 204-5. In addition, the region extending in the direction D1 overlaps the conductive layer 206-11 and is connected to the conductive layer 206-11 via a contact hole 215-7 arranged in the insulating film 205. The conductive layer 208-2 extends in the direction D2. The conductive layer 208-2 overlaps the conductive layer 206-5 and the conductive layer 206-6, and is connected to the conductive layer 206-5 and the conductive layer 206-6 via contact holes 215-3 and 215-4 arranged in the insulating film 205. The conductive layer 208-3 extends in the direction D2. The conductive layer 208-3 overlaps the conductive layer 206-7 and the conductive layer 206-8, and is connected to the conductive layer 206-7 and the conductive layer 206-8 via contact holes 215-5 and 215-6 arranged in the insulating film 205.

Figure 16:
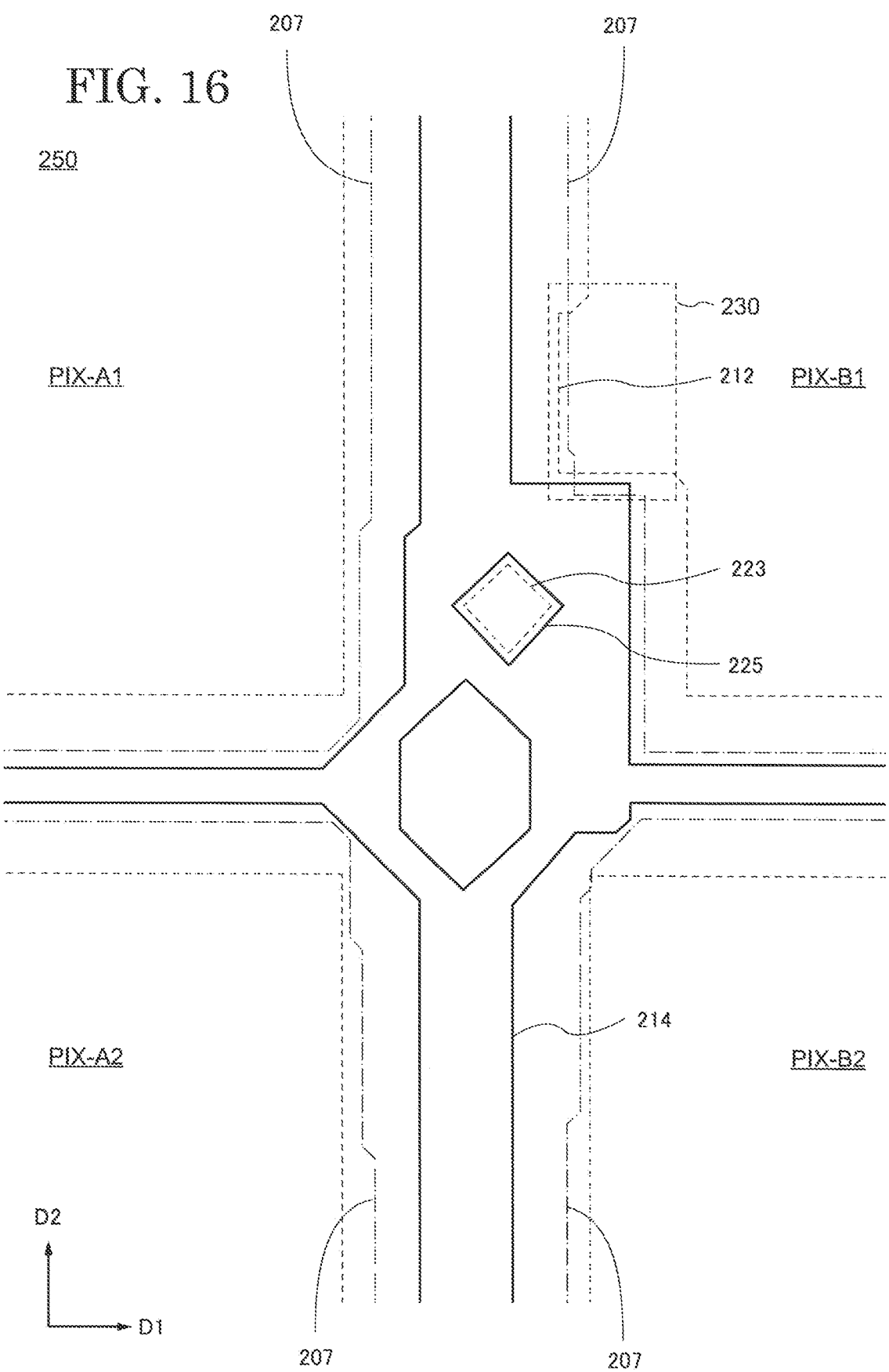
FIG. 16 is a planar layout of pixels in a display device according to an embodiment of the present invention.

FIG. 16 is a planar layout of the planarization film 207, the transparent conductive layer 212, and the conductive layer 214 in the region 250. The planarization film 207 has been removed in the opening region of the pixel PIX as shown in FIG. 8. That is, the planarization film 207 is arranged above the wiring region. The transparent conductive layer 212 is arranged above the planarization film 207. In addition, the conductive layer 214 is arranged above the transparent conductive layer 212. The transparent conductive layer 212 and the conductive layer 214 function as the capacitance wiring CW. The transparent conductive layer 212 is arranged above the conductive layers 206-1 to 206-11 via the planarization film 207. Therefore, the source wirings SL1 to SL4 and the capacitance wiring CW wiring are arranged apart from each other, so that it is less likely to be affected by the voltage from the capacitance wiring CW. In addition, the electrical resistance of the conductive layer 214 is less than the electrical resistance of the transparent conductive layer 212. Therefore, variation in the voltage of the capacitance wiring CW due to the position where the pixel PIX is positioned in the display region 12 is suppressed. In addition, the transparent conductive layer 212 has an opening 223 and the conductive layer 214 has an opening 225. The opening 223 and the opening 225 are arranged so as to overlap each other.

The transparent conductive layer 212 and the conductive layer 214 are arranged in a grid pattern so as to cover the gate wiring GL and the source wirings SL1 to SL4. This reduces the storage capacitor C between a region without the transparent conductive layer 212 and the pixel electrode 216. The storage capacitor C is adjusted according to the size of the region without the transparent conductive layer 212. In addition, the transparent conductive layer 212 may not be arranged in the grid pattern, but may be arranged on the entire surface. Further, the conductive layer 214 is arranged so as to cover the transistor Tr. As a result, light leakage of the transistor Tr can be suppressed.

Although an example in which the conductive layer 214 is arranged above the transparent conductive layer 212 is shown, it may be arranged below the transparent conductive layer 212. The conductive layer 214 may be stacked with the transparent conductive layer 212. The conductive layer 214 has a light-shielding effect. Therefore, the wiring region can be shielded from light. The conductive layer 214 is arranged so that the width is larger than the combined width of the source wirings SL1 to SL4 in a plan view. In addition, the conductive layer 214 is arranged so that the width is larger than the width of the gating wiring GL in a plan view. As a result, it is possible to suppress a display panel 11 from emitting the reflected light reflected by the edges of the source wirings SL1 to SL4. In addition, the width of the conductive layer 214 and the combined width of the source wirings SL1 to SL4 refer to the length in the direction (direction D2) intersecting the direction in which the source wirings SL1 to SL4 extend. Further, the width of the gate wiring GL refers to the length in the direction (direction D2) intersecting the direction in which the gate wiring GL extends.

Figure 17:
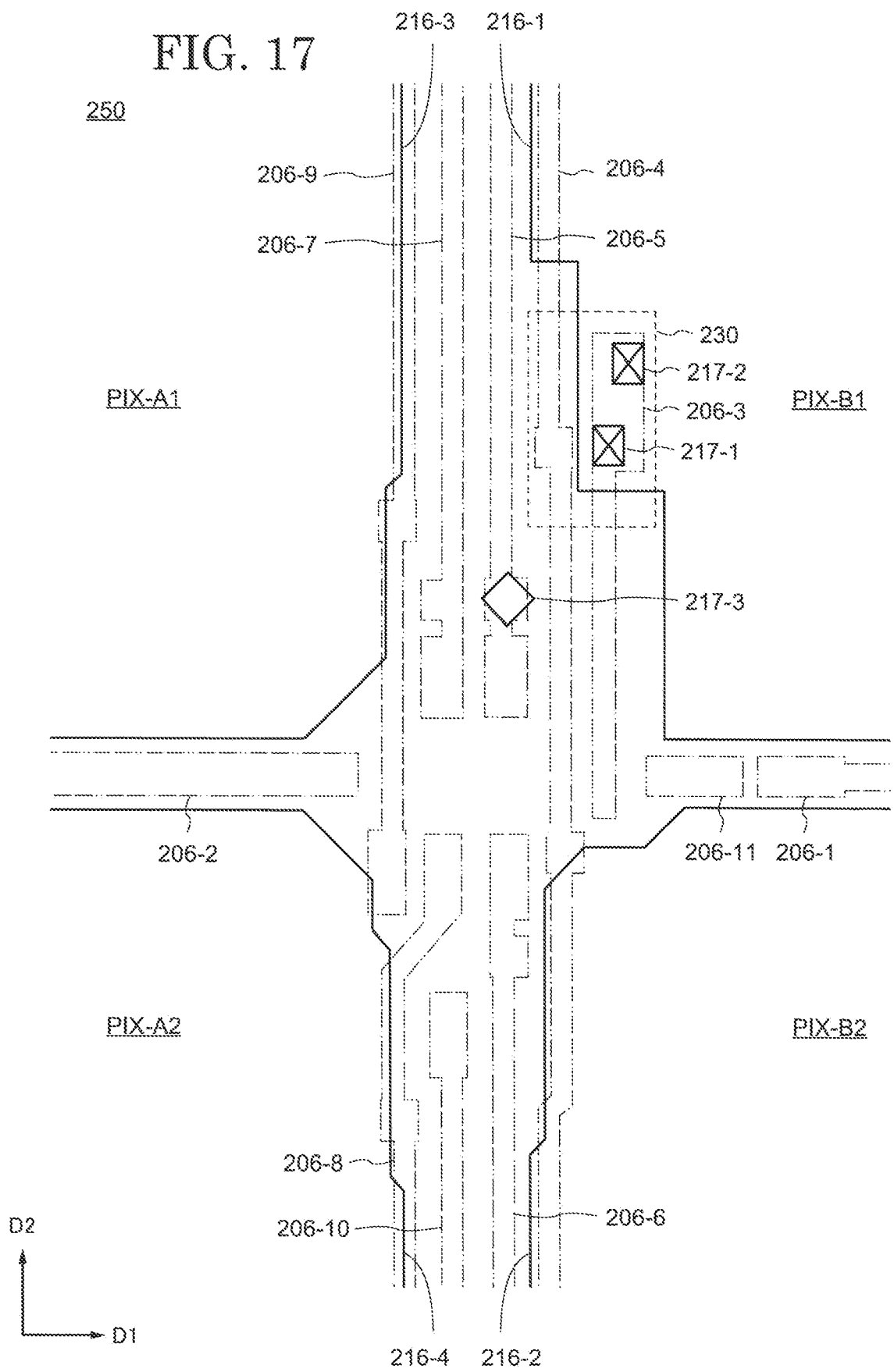
FIG. 17 is a planar layout of pixels in a display device according to an embodiment of the present invention.

FIG. 17 is a planar layout of the conductive layers 206-1 to 206-11 and the pixel electrodes 216-1 to 216-4 in the region 250. The conductive layers 206-1 to 206-11 are as described in FIG. 14. The pixel electrodes 216-1 to 216-4 are arranged above the insulating film 209. The pixel electrodes 216-1 to 216-4 are arranged in the opening region of the pixel PIX. The pixel electrode 216-1 is connected to the conductive layer 206-3 via the contact holes 217-1 and 217-2 arranged in the insulating film 209 and the contact holes 215-1 and 215-2 (see FIG. 15) arranged in the insulating film 205. In addition, the insulating film 209 has a contact hole 217-3. The contact hole 217-3 is arranged so as to overlap the opening 223 and the opening 225 (see FIG. 16). Arranging the openings 223 and 225 and the contact holes 217-3 above the planarization film 207 makes it possible to discharge the water contained in the planarization film 207 via the openings 223 and 225 and the contact hole 217-3.

As described above, the conductive layer 202 and the conductive layer 206 are arranged so as to be stacked on each other and extend as the gate wirings GL1 to GL4 and the source wirings SL1 to SL4 in the display region 12. Arranging the source wirings SL1 to SL4 so that the conductive layer 202 and the conductive layer 206 are stacked and extended makes it possible to make uniform the resistance of the source wirings SL1 to SL4 and to make uniform the wiring capacitance. In addition, the source wiring SL1 and the source wiring SL3 can be arranged to intersect each other, and the source wiring SL2 and the source wiring SL4 can be arranged to intersect each other.

<Materials of Each Member of Display Device 10>

A rigid substrate having light transmittance and no flexibility, such as a glass substrate, a quartz substrate, and a sapphire substrate, can be used as the array substrate 150 and the counter substrate 152. On the other hand, in the case where the array substrate 150 and the counter substrate 152 need to have flexibility, a flexible substrate containing a resin and having flexibility, such as a polyimide substrate, an acryl substrate, a siloxane substrate, or a fluororesin substrate, can be used as the array substrate 150 and the counter substrate 152. In order to improve the heat resistance of the array substrate 150 and the counter substrate 152, impurities may be introduced into the resin. In addition, in the case where the display device 10 is applied to a large transparent display, a glass substrate is preferably used as the array substrate 150 and the counter substrate 152. Further, the first transparent substrate 151A and the second transparent substrate 151B are arranged to protect the array substrate 150 and the counter substrate 152. For this reason, for example, it is preferable to use a glass substrate, a plastic substrate, or the like having light transmittance.

Silicon nitride ($SiN_x$), silicon nitride oxide ($SiN_xO_y$), aluminum nitride ($AlN_x$), and aluminum nitride oxide ($AlN_xO_y$) are used as the nitride insulating films 203a and 205b and the insulating film 209. Silicon nitride is used as the nitride insulating films 203a and 205b and the insulating film 209 in the present embodiment. For example, the silicon nitride film is formed by a sputtering method.

Silicon oxide ($SiO_x$), silicon oxynitride ($SiO_xN_y$), aluminum oxide ($AlO_x$), and aluminum oxynitride ($AlO_xN_y$) are used as the oxide insulating films 203b and 205a. Silicon oxide is used as the oxide insulating films 203b and 205a in the present embodiment.

$SiO_xN_y$ and $AlO_xN_y$ are silicon-containing and aluminum-containing compounds that contain a smaller proportion ($x>y$) of nitrogen (N) than oxygen (O). $SiN_xO_y$ and $AlN_xO_y$ are silicon-containing and aluminum-containing compounds containing a lower proportion ($x>y$) of oxygen than nitrogen.

An organic insulating material, such as a polyimide resin, an acryl resin, an epoxy resin, a silicone resin, a fluororesin, or a siloxane resin, can be used as the planarization film 207.

Common metal materials can be used as the conductive layer 202, the conductive layer 208, and the conductive layer 214. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and an alloy or compound thereof are used as these members. The above-described materials may be used in a single layer or in a stacked layer as the above-described members.

An oxide semiconductor having semiconducting properties can be used as the oxide semiconductor layer 204. The oxide semiconductor layer 204 has light transmittance. For example, an oxide semiconductor containing two or more metals including indium (In) is used as the oxide semiconductor layer 204. For example, an oxide semiconductor containing indium (In), gallium (Ga), zinc (Zn), and oxygen (O) may be used as the oxide semiconductor layer 204. In particular, an oxide semiconductor having a composition ratio of In:Ga:Zn:O=1:1:1:4 may be used as the oxide semiconductor layer 204. However, the oxide semiconductor layer 204 used in the present embodiment is not limited to the above-described compositions, and an oxide semiconductor having compositions other than those described above can also be used.

A mixture (ITO) of indium oxide and tin oxide and a mixture (IZO) of indium oxide and zinc oxide can be used as the transparent conductive layer 212, the pixel electrode 216, and the common electrode 218. A material other than the above may be used as the transparent conductive layer. The light-shielding layer 219 used in a black matrix BM may be formed of a black resin or metal material. The black matrix BM is formed in contact with the common electrode 218 (see FIG. 8). The common electrode 218 is formed of a transparent conductive film, and the black matrix BM is formed of a metal material, whereby it is possible to provide a function as an auxiliary electrode for reducing resistance dissipation. A single layer or a stacked layer of chrome, molybdenum, titanium, or the like having a relatively low reflectance with respect to aluminum can be used as the metal material for forming the black matrix BM.

In the case where the display device 10 is applied to a transparent display, a polymer-dispersed liquid crystal is preferably used as the liquid crystal layer 210. The polymer-dispersed liquid crystal contains bulk and fine particles. The orientation of the fine particles varies in the bulk depending on the voltage difference between the pixel electrode 216 and the common electrode 218. The degree of at least one of light transmission and distribution is controlled for each pixel PIX by individually controlling the voltage of the pixel electrode 216 for each pixel PIX. The degree of scattering of the liquid crystal layer (fine particles) is controlled according to the voltage of each pixel electrode 216 and the voltage of the common electrode 218. For example, a polymer-dispersed liquid crystal in which the degree of scattering increases as the voltage between each pixel Pix and the common electrode 218 increases, or a polymer-dispersed liquid crystal in which the degree of scattering increases as the voltage between each pixel electrode 216 and the voltage between the common electrode 218 decreases may be used as the liquid crystal layer.

The ordinary refractive indices of the bulk and fine particles are equal to each other in the liquid crystal layer 210. In the state where no voltage is applied between the pixel electrode 216 and the common electrode 218, the refractive index difference between the bulk and the fine particles is zero in all directions. The liquid crystal layer 210 is in a non-scattering state without scattering the light emitted from the light source. The light emitted from the light source propagates in a direction away from a light source 3 (light-emitting unit) while being reflected by a first main surface of the array substrate 150 and a first main surface of the counter substrate 152. In the case where the liquid crystal layer 210 is in the non-scattering state in which the light L emitted from the light source is not scattered, the background of the counter substrate 152 can be visually recognized from the array substrate 150 and the background of the array substrate 150 can be visually recognized from the counter substrate 152.

The optical axis of the fine particles will be tilted between the pixel electrode 216 and the common electrode 218 by an electric field generated between the pixel electrode 216 and the common electrode 218 to which a voltage is applied. Since the optical axis of the bulk does not change depending on the electric field, the orientations of the optical axis of the bulk and the optical axis of the fine particles are different from each other. The light emitted from the light source is scattered in the pixel PIX having the pixel electrode 216 to which the voltage is applied. Part of the scattered light emitted from the light source as described above is emitted to the outside from the first main surface of the array substrate 150 or the first main surface of the counter substrate 152 is observed by an observer.

The background of the first main surface side of the counter substrate 152 is visible from the first main surface of the array substrate 150, and the background of a first main surface 10A side of the array substrate 150 is visible from a first main surface 20A of the counter substrate 152, in a pixel of the pixel electrode 216 with no voltage applied. Then, the video signal is input to the display device 10 of the present embodiment, the voltage is applied to the pixel electrode 216 of the pixel PIX on which the image is displayed, and an image based on the video signal is visually recognized together with the background. As described above, in the case where the polymer-dispersed liquid crystal is in a scattering state, an image is displayed in the display region.

While preferred embodiments have been described above, the present invention is not limited to such embodiments. The contents disclosed in the embodiments are merely examples, and various changes can be made without departing from the spirit of the present invention. Appropriate changes that have been made without departing from the spirit of the present invention naturally fall within the technical scope of the present invention.

What is claimed is:

1. A display device comprising:
a transistor having an oxide semiconductor layer, a gate a electrode opposed to the oxide semiconductor layer, and a gate insulating film arranged between the oxide semiconductor layer and the gate electrode;
a drain electrode connected to the transistor;
a pixel electrode connected to the drain electrode; and
a first insulating film and a second insulating film arranged between the drain electrode and the pixel electrode,
wherein the drain electrode extends in a first direction,
the first insulating film includes a first contact hole and a second contact hole, the first contact hole and the second contact hole are arranged along the first direction in a region overlapping the drain electrode, and
the second insulating film includes a third contact hole and a fourth contact hole, the third contact hole and the fourth contact hole are arranged along the first direction in a region overlapping the drain electrode,
a symmetry axis of the first contact hole in the first direction is displaced in a second direction intersecting the first direction with respect to a symmetry axis of the third contact hole in the first direction, and a symmetry axis of the second contact hole in the first direction is displaced in a third direction opposite to the second direction with respect to a symmetry axis of the fourth contact hole in the first direction in a plan view.

2. The display device according to claim 1, wherein the second insulating film is in contact with the drain electrode in a region where the first contact hole is arranged and a region where the second contact hole is arranged.

3. The display device according to claim 1, wherein an area of the first contact hole is larger than an area of the third contact hole, and an area of the second contact hole is larger than an area of the fourth contact hole.

4. The display device according to claim 1, wherein an area of the first contact hole is substantially the same as an area of the second contact hole, and an area of the third contact hole is substantially the same as an area of the fourth contact hole.

5. The display device according to claim 1, wherein an area of a first region where the pixel electrode contacts the drain electrode via the first contact hole and the third contact hole is different from an area of a second region where the pixel electrode contacts the drain electrode via the second contact hole and the fourth contact hole.

6. The display device according to claim 1, wherein an area of a first region where the pixel electrode contacts the drain electrode via the first contact hole and the third contact hole is substantially the same as an area of a second region where the pixel electrode contacts the drain electrode via the second contact hole and the fourth contact hole.

7. The display device according to claim 1, wherein the pixel electrode contacts a top surface of the first insulating film in the third contact hole and the fourth contact hole.

8. The display device according to claim 1, further comprising:
  - a second substrate arranged opposite to the first substrate;
  - a liquid crystal layer between the first substrate and the second substrate; and
  - a light source arranged so that light enters toward a side of the first substrate or a side of the second substrate.

9. The display device according to claim 8, wherein
  the liquid crystal layer is a polymer-dispersed liquid crystal,
  an image is displayed in a display region when the polymer-dispersed liquid crystal is in a scattering state, and
  a background of the second substrate is visible from the first substrate and a background of the first substrate is visible from the second substrate in the display region when the polymer-dispersed liquid crystal is in a non-scattering state.

\* \* \* \* \*